(12) United States Patent
Jeong et al.

(10) Patent No.: US 8,049,402 B2
(45) Date of Patent: Nov. 1, 2011

(54) ORGANIC LIGHT EMITTING DIODE DISPLAY AND METHOD FOR MANUFACTURING THE SAME

(75) Inventors: Byoung-Seong Jeong, Yongin-si (KR); Joon-Hoo Choi, Seoul (KR); Yong-Hwan Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1037 days.

(21) Appl. No.: 11/927,538

(22) Filed: Oct. 29, 2007

(65) Prior Publication Data
US 2008/0180363 A1    Jul. 31, 2008

(30) Foreign Application Priority Data
Jan. 26, 2007  (KR) .................. 10-2007-0008549

(51) Int. Cl.
*H01J 1/62* (2006.01)
*H01J 63/04* (2006.01)
*H01J 17/49* (2006.01)
(52) U.S. Cl. ........ 313/500; 313/483; 313/503; 313/504; 313/505; 313/506; 445/24; 445/25; 445/1
(58) Field of Classification Search .................. None
See application file for complete search history.

(56) References Cited

U.S. PATENT DOCUMENTS

| | | | |
|---|---|---|---|
| 7,750,988 B2* | 7/2010 | Kim | 349/44 |
| 7,759,862 B2* | 7/2010 | Park et al. | 313/506 |
| 2004/0195959 A1* | 10/2004 | Park et al. | 313/500 |
| 2008/0048560 A1* | 2/2008 | Sung et al. | 313/504 |

* cited by examiner

*Primary Examiner* — Natalie Walford
(74) *Attorney, Agent, or Firm* — Innovation Counsel LLP

(57) ABSTRACT

An improved OLED display includes a substrate, a semiconductor having a uniform thickness formed on the substrate, first and second ohmic contacts, and a driving voltage line having an input electrode and an output electrode. An insulating layer is formed on the driving voltage line and the output electrode. A control electrode is formed on the insulating layer and overlaps the semiconductor.

The method of manufacturing the OLED display entails forming a semiconductor on a substrate, forming a photoresist film on the semiconductor, forming a doped amorphous silicon layer on the photoresist film, removing the photoresist film along with a portion of the doped amorphous silicon disposed on the photoresist film to form first and second ohmic contacts, respectively forming input and output electrodes on the first and second ohmic contacts, forming an insulating layer on the input and output electrodes, and forming a control electrode on the insulating layer.

10 Claims, 62 Drawing Sheets

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2007-0008549 filed in the Korean Intellectual Property Office on Jan. 26, 2007, the entire contents of which are incorporated herein by reference.

BACKGROUND OF THE INVENTION (a) Field of the Invention

The present invention relates to an organic light emitting diode display and a method for manufacturing the same.

(b) Description of the Related Art

Recent trends toward light and thin personal computers and television sets require light and thin display devices. Flat panel displays such as a liquid crystal display (LCD) that can satisfy such requirement are thus becoming increasingly common substitutes for conventional cathode ray tubes (CRTs).

However, because the LCD is a passive display device, a backlight is needed as a light source. Associated with the fact that LCD is a passive display device are various problems such as slow response time and narrow viewing angle.

Among the flat panel displays, organic light emitting diode (OLED) display has recently been the most promising as a display device for solving these problems.

An OLED display is a self emissive display device, and includes two electrodes and an organic light emitting layer interposed between the two electrodes. One of the two electrodes injects holes and the other injects electrons into the light emitting layer. The injected electrons and holes are combined to form excitons and the excitons emit light as discharge energy upon changing their energy levels.

Some advantages of the OLED display include its low power consumption, fast response time, wide viewing angle, and high contrast ratio.

OLED displays are divided into passive matrix OLED displays and active matrix OLED displays according to how they are driven.

The active matrix OLED display includes a plurality of switching thin film transistors connected to signal lines that cross each other, a plurality of driving thin film transistors connected to the switching thin film transistors and driving voltage lines, and a plurality of emitting portions connected to the driving thin film transistors.

The semiconductor of the TFT is made of amorphous silicon and polycrystalline silicon according to the crystal structure of the silicon.

Amorphous silicon is used in displays utilizing glass having a low melting point, since an amorphous silicon film can be fabricated at a low temperature. However, amorphous silicon film may not be well suited for application to a high quality driving circuit in display panels because it has low carrier mobility. Since polycrystalline silicon has prominent electric field effect mobility and high frequency operation, high quality driving circuits often use polycrystalline silicon. However, the TFT of polycrystalline silicon has difficulty in the manufacturing process and disadvantages such as a large leak current. Particularly, when etching the semiconductor, the surface of the semiconductor may be damaged such that the current leakage may be increased.

SUMMARY OF THE INVENTION

The organic light emitting diode (OLED) display of the present invention reduces damage to the surface of the semiconductor to improve the electrical characteristics of the thin film transistor.

In one aspect, the invention is an organic light emitting diode display that includes a substrate, a first semiconductor having a uniform thickness formed on the substrate, first and second ohmic contacts formed on the first semiconductor, a driving voltage line formed on the first and the second ohmic contacts and having a first input electrode, and a first output electrode that is separated from the first input electrode, a first insulating layer formed on the driving voltage line and the first output electrode, and a first control electrode formed on the first insulating layer and overlapping the first semiconductor.

The surface of the first semiconductor may be flat.

The organic light emitting diode display may further include a second semiconductor formed on the substrate, third and fourth ohmic contacts formed on the second semiconductor, and a second output electrode and a second input electrode respectively formed on the third and fourth ohmic contacts, wherein the second output electrode is electrically connected to the first control electrode. A second control electrode is formed on the first insulating layer and overlaps the second semiconductor.

The organic light emitting diode display may further include a second control electrode formed on the first insulating layer, a second insulating layer formed on the second control electrode, and a second semiconductor formed on the second insulating layer and overlapping the second control electrode. Third and fourth ohmic contacts may be formed on the second semiconductor, and a second output electrode and a second input electrode may be respectively formed on the third and the fourth ohmic contacts, wherein the second output electrode is electrically connected to the first control electrode.

The organic light emitting diode display may further include a second control electrode formed on the substrate, a second semiconductor formed on the first insulating layer and overlapping the second control electrode, third and fourth ohmic contacts formed on the second semiconductor, and a second output electrode and a second input electrode respectively formed on the third and the fourth ohmic contacts wherein the second output electrode is electrically connected to the first control electrode.

The first semiconductor may be made of polycrystalline silicon.

The organic light emitting diode display may further include a passivation layer formed on the first input electrode and the first output electrode, a first electrode formed on the passivation and connected to the first output electrode, a light emitting member formed on the first electrode, and a second electrode formed on the light emitting member.

The first semiconductor may comprise a first portion positioned between the substrate and the first ohmic contact and a second portion positioned between the substrate and the first insulation layer, and the first portion and the second portion may have substantially the same thickness. In another aspect, the invention is a method for manufacturing an organic light emitting diode display. The method includes forming a first semiconductor on a substrate; forming a photoresist film on the first semiconductor; forming a doped amorphous silicon layer on the photoresist film; removing the photoresist film along the portion of the doped amorphous silicon disposed on the photoresist film to form first and second ohmic contacts; respectively forming first input and first output electrodes on the first and second ohmic contacts; forming a first insulating layer on the first input and first output electrodes; and forming a first control electrode on the first insulating layer.

The method may further include forming a second semiconductor on the substrate; forming third and fourth ohmic contacts on the second semiconductor; forming a second input electrode on the third ohmic contact; forming a second output electrode electrically connected to the first input electrode on the fourth ohmic contact; and forming a second control electrode overlapping the second semiconductor on the first insulating layer.

The method may further include forming a second control electrode on the first insulating layer; forming a second insulating layer on the second control electrode; forming a second semiconductor overlapping the second control electrode on the second insulating layer; forming third and fourth ohmic contacts on the second semiconductor; and respectively forming a second output electrode electrically connected to the first control electrode, and a second input electrode respectively on the third and the fourth ohmic contacts.

The method may further include forming a second control electrode on the substrate; forming a second semiconductor overlapping the second control electrode on the first insulating layer; forming third and fourth ohmic contacts on the second semiconductor; and respectively forming a second output electrode electrically connected to the first control electrode, and a second input electrode on the third and fourth ohmic contacts.

The amorphous silicon layer may be deposited at a low temperature of less than 150 degrees.

The substrate may be thermal-treated at a temperature of about 450 degrees after forming the first and second ohmic contacts.

The method may further include HF cleaning the substrate after thermal-treating the substrate, and plasma treating the substrate to stabilize the first and second semiconductor.

The plasma treatment may be progressed in the conditions of about 200 Watt/12,000 mm$^2$ power and about 1000-3000 mT pressure with a flow rate of about 1000-3000 sccm for 90-180 seconds.

The amorphous silicon layer may be crystallized by solid phase crystallization (SPC), and is patterned to form the first and second semiconductors.

The photoresist film may have openings extending to portions of the first semiconductor, and the openings may have substantially the same shapes as the first and second ohmic contacts in plan view.

BRIEF DESCRIPTION OF THE DRAWINGS

The above and other advantages of the present invention will become more apparent by describing preferred embodiments thereof in detail with reference to the accompanying drawings, in which.

DETAILED DESCRIPTION OF EMBODIMENTS

Figure 1:
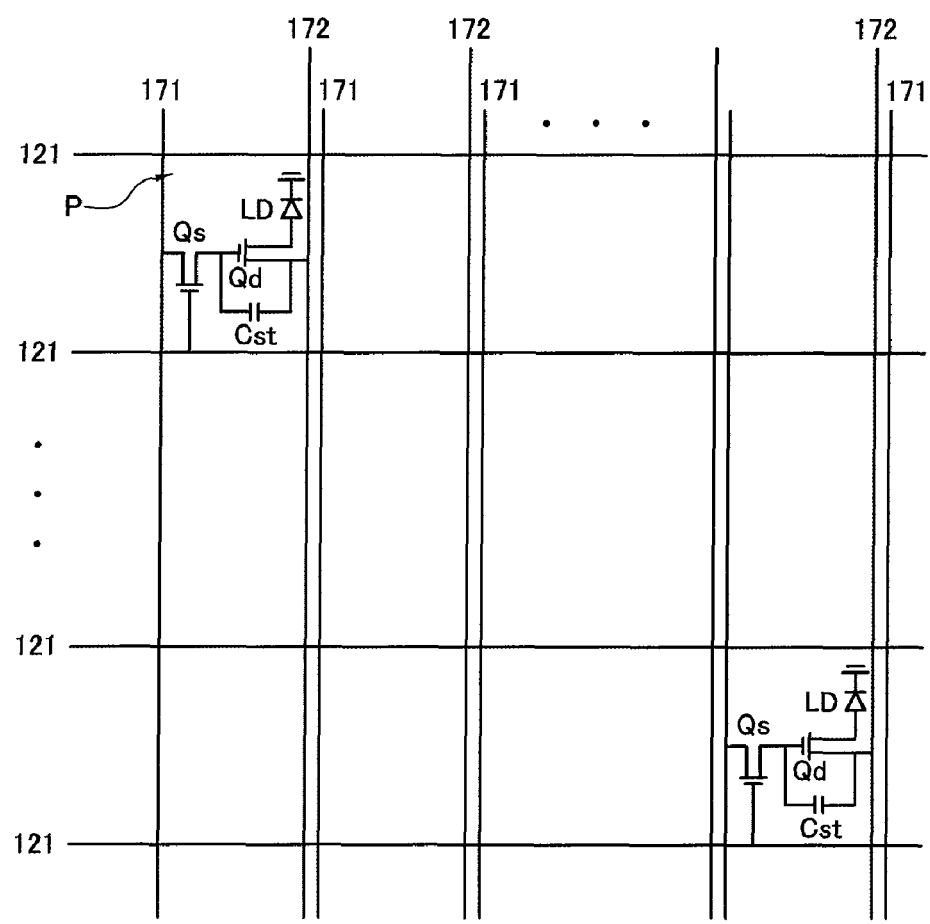
FIG. 1 is an equivalent circuit diagram of an OLED according to an embodiment of the present invention.

The present invention will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an OLED according to an embodiment of the present invention will be described in detail with reference to FIG. 1.

FIG. 1 is an equivalent circuit diagram of a pixel of an OLED according to an embodiment of the present invention.

Referring to FIG. 1, an OLED display according to an embodiment of the present invention includes a plurality of signal lines 121, 171, and 172, and a plurality of pixels P that are arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a first direction and substantially parallel to each other, while the data lines 171 and the driving voltage lines 172 extend substantially in a second direction that is perpendicular to the first direction. The data lines 171 and the driving voltage lines 172 are substantially parallel to each other.

Each pixel P includes a switching transistor Qs, a driving transistor Qd, a capacitor Cst, and an OLED LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving signal line 172, and an output terminal connected to the OLED LD. The driving transistor Qd drives an output current ILD having a magnitude depending on the voltage between the control terminal and the output terminal.

The capacitor Cst is connected between the control terminal and the output terminal of the driving transistor Qd. The capacitor Cst stores the data signal applied to the control terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity depending on an output current ILD of the driving transistor Qd, thereby displaying images.

The switching transistor Qs and the driving transistor Qd are n-channel field effect transistors (FETs). However, at least one of switching transistor Qs and the driving transistor Qd may be a p-channel FET. In addition, the connections among the transistors Qs and Qd, the capacitor Cst, and the OLED LD may be modified.

Figure 2:
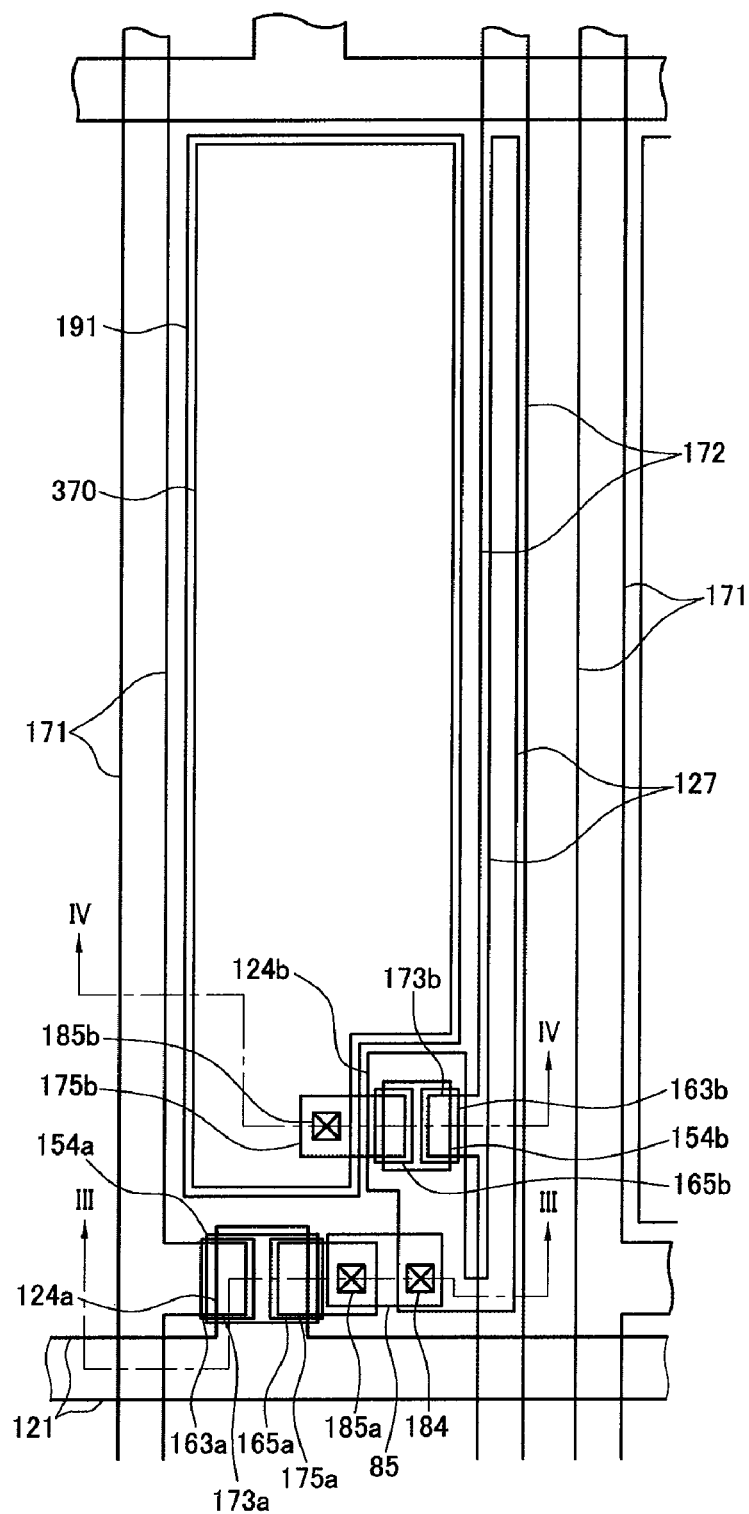
FIG. 2 is an exemplary layout view of a TFT array panel for the OLED according to an embodiment of the present invention.
Figure 3:
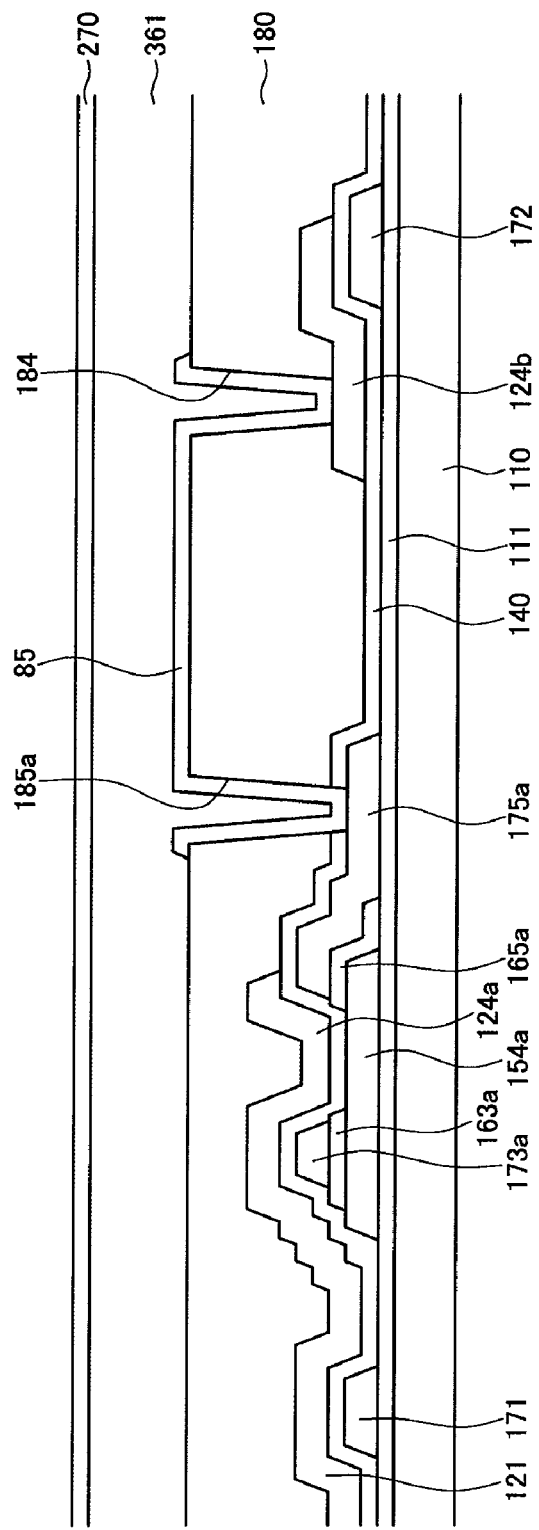
FIGS. 3 and 4 are sectional views of the TFT array panel shown in FIG. 2, taken along the lines III-III and IV-IV, respectively.
Figure 4:
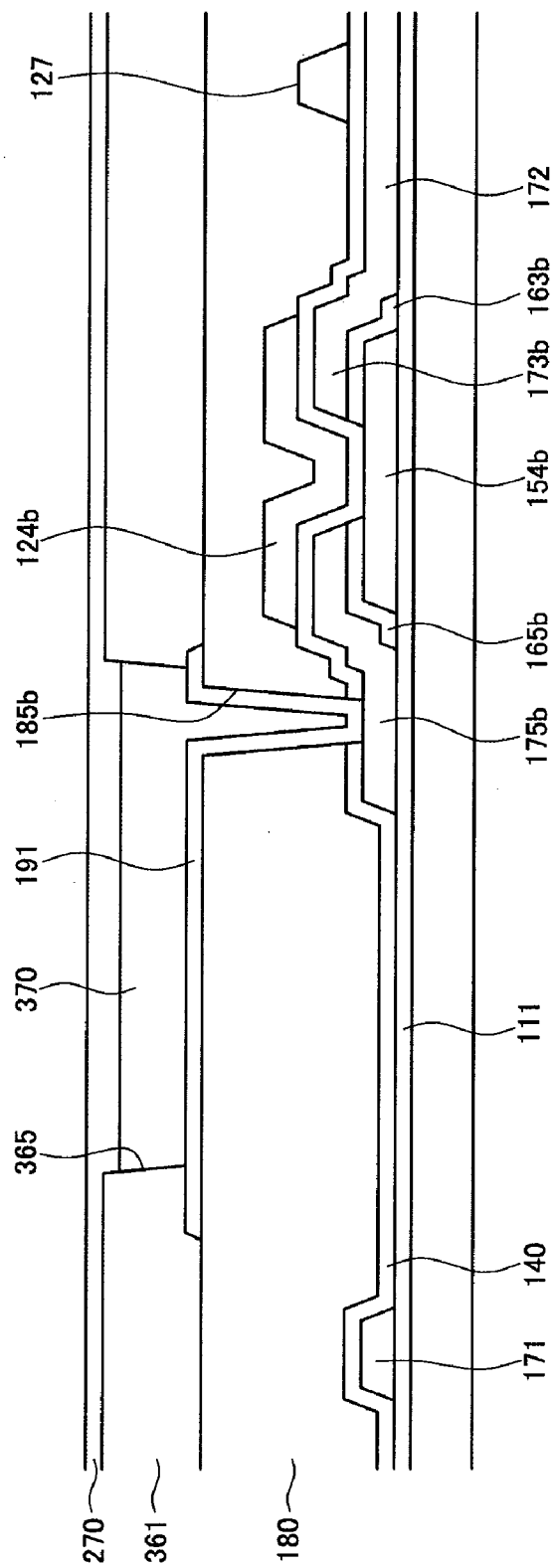

Referring to FIGS. 2 to 4, a detailed structure of the OLED display shown in FIG. 1 according to an embodiment of the present invention will be described in detail.

FIG. 2 is a schematic plan view of an OLED according to an embodiment of the present invention, and FIGS. 3 and 4 are sectional views of the OLED shown in FIG. 2 taken along the lines III-III and IV-IV.

A blocking film 111 preferably made of silicon oxide ($SiO_2$) or silicon nitride ($SiN_x$) is formed on an insulating substrate 110 such as transparent glass, quartz, or sapphire. The blocking film 111 may have a dual-layered structure.

A plurality of switching and driving semiconductor islands 154a and 154b preferably made of hydrogenated amorphous silicon (abbreviated to "a-Si") or polysilicon are formed on the blocking film 111.

A plurality of pairs of ohmic contacts 163a and 165a and a plurality of pairs of ohmic contacts 163b and 165b are respectively formed on the semiconductor islands 154a and 154b, respectively. The ohmic contacts 163a, 163b, 165a, and 165b are preferably made of silicide or n+ hydrogenated a-Si heavily doped with an n-type impurity such as phosphorus. The ohmic contacts 163a and 165a are located in pairs on the switching semiconductor islands 154a, and the ohmic contacts 163b and 165b are located in pairs on the driving semiconductor islands 154b.

A plurality of data conductors including a plurality of data lines 171, a plurality of driving voltage lines 172, and a plurality of switching and driving output electrodes 175a and 175b are formed on the ohmic contacts 163a, 163b, 165a, and 165b and the blocking layer 111.

The data lines 171 for transmitting data signals extend substantially in the longitudinal direction. Each data line 171 includes a plurality of switching input electrodes 173a overlapping the switching semiconductor islands 154a and may include an end portion (not shown) having a large area for contact with another layer or an external driving circuit. The data lines 171 may extend to be directly connected to a data driving circuit (not shown) for generating the data signals, which may be integrated on the substrate 110.

The driving voltage lines 172 for transmitting driving voltages extend substantially in the second direction. Each driving voltage line 172 includes a plurality of driving input electrodes 173b overlapping the driving semiconductor islands 154b.

Switching and driving output electrodes 175a and 175b are separated from each other and from the data lines 171 and the driving voltage lines 172. Each pair of the switching input electrodes 173a and the switching output electrodes 175a are disposed opposite each other with respect to the switching semiconductor islands 154a, and each pair of the driving input electrodes 173b and the driving output electrodes 175b are disposed opposite each other with respect to the driving semiconductor islands 154b.

The data conductors 171, 172, 175a, and 175b are preferably made of a refractory metal such as Mo, Cr, Ta, Ti, or alloys thereof. In some embodiments, the data conductors

171, 172, 175a, and 175b may have a multi-layered structure preferably including a refractory metal film and a low resistivity film. Examples of the multi-layered structure are a double-layered structure including a lower Cr film and an upper Al (alloy) film, a double-layered structure of a lower Mo (alloy) film and an upper Al (alloy) film, and a triple-layered structure of a lower Mo (alloy) film, an intermediate Al (alloy) film, and an upper Mo (alloy) film. However, the data conductors 171, 172, 175a, and 175b may be made of various other metals or conductors.

The data conductors 171, 172, 175a, and 175b have inclined edge profiles whose inclination angles range from about 30 to 80 degrees.

The ohmic contacts 163a, 163b, 165b, and 165b are interposed only between the underlying switching and driving semiconductor islands 154a and 154b and the overlying data conductors 171, 172, 175a, and 175b, and reduce the contact resistance between the layers it separates.

A gate insulating layer 140 preferably made of silicon nitride ($SiN_x$) or silicon oxide ($SiO_x$) is formed on the data conductors 171, 172, 175a, and 175b.

A plurality of gate conductors that include a plurality of gate lines 121 including switching control electrodes 124a, and a plurality of driving control electrodes 124b, are formed on the gate insulating layer 140.

The gate lines 121 for transmitting gate signals extend substantially in the first direction and intersect the data lines 171 and the driving voltage lines 172. Each gate line 121 may further include an end portion (not shown) having a large area for contact with another layer or an external driving circuit, and the switching control electrodes 124a project from the gate line 121. The gate lines 121 may extend to be directly connected to a gate driving circuit (not shown) for generating the gate signals, which may be integrated on the substrate 110.

Each of the driving control electrodes 124b is separated from the gate lines 121 and extends downward, rightward, and upward (in reference to FIG. 2) to form a storage electrode 127, and the storage electrodes 127 overlap the driving voltage lines 172.

The gate conductors 121 and 124b are preferably made of an Al-containing metal such as Al and an Al alloy, a Ag-containing metal such as Ag and a Ag alloy, a Cu-containing metal such as Cu and Cu alloy, a Mo-containing metal such as Mo and a Mo alloy, Cr, Ta, Ti, etc. The gate conductors 121 and 124b may have a multi-layered structure including two films having different physical characteristics. One of the two films is preferably made of a low resistivity metal such as an Al-containing metal, a Ag-containing metal, and a Cu-containing metal for reducing signal delay or voltage drop. The other film is preferably made of a material such as a Mo-containing metal, Cr, Ta, or Ti, which has good physical, chemical, and electrical contact characteristics with other materials such as indium tin oxide (ITO) or indium zinc oxide (IZO). Examples of the combination are a lower Cr film and an upper Al (alloy) film, and a lower Al (alloy) film and an upper Mo (alloy) film. However, the gate conductors 121 and 124b may be made of various other metals or conductors.

The lateral sides of the gate conductors 121 and 124b are inclined relative to a surface of the substrate 110, forming an inclination angle that falls in a range from about 30 to 80 degrees.

The switching and driving semiconductor islands 154a and 154b respectively overlap the switching and driving control electrodes 124a and 124b.

A passivation layer 180 is formed on the gate conductors 121 and 124b.

The passivation layer 180 is preferably made of an inorganic or organic insulator, and it may have a flat top surface. Examples of the inorganic insulator include silicon nitride and silicon oxide. The organic insulator may have photosensitivity and a dielectric constant of less than about 4.0.

The passivation layer 180 has a plurality of contact holes 185a and 185b exposing the switching output electrodes 175a and the driving output electrodes 175b, respectively, and the passivation layer 180 and the gate insulating layer 140 have a plurality of contact holes 184 exposing the second control electrodes 124b.

A plurality of pixel electrodes 191 and a plurality of connection members 85 are formed on the passivation layer 180, and they are preferably made of a transparent conductor such as ITO or IZO, or a reflective conductor such as Al, Ag, or alloys thereof.

The pixel electrodes 191 are connected to the switching output electrodes 175b through the contact holes 185b. The connecting members 85 are connected to the driving control electrodes 124b and the switching output electrodes 175a through the contact holes 184 and 185a, respectively.

A partition 361 is formed on the passivation layer 180. The partition 361 surrounds the pixel electrodes 191 to define openings 365, and it is preferably made of an organic or inorganic insulating material. The partition 361 may be made of a photosensitive material containing a black pigment so that the black partition 361 may serve as a light blocking member and the formation of the partition 361 may be simplified.

A plurality of light emitting members 370 are formed on the pixel electrodes 191 and confined in the openings 365 defined by the partition 361. Each of the light emitting members 370 is preferably made of an organic material uniquely emitting light of one primary color such as red, green, and blue. The OLED display displays images by spatially adding the monochromatic primary color light emitted from the light emitting members 370. Hereinafter, the pixels representing red, green, and blue light are referred to as red, green, and blue pixels and are denoted by R, G, and B.

Each of the light emitting members 370 may have a multi-layered structure including an emitting layer (not shown) for emitting light and auxiliary layers (not shown) for improving the efficiency of light emission of the emitting layer. The auxiliary layers may include an electron transport layer (not shown) and a hole transport layer (not shown) that balance the numbers of electrons and holes, and an electron injecting layer (not shown) and a hole injecting layer (not shown) for improving the injection of electrons and holes.

A common electrode 270 is formed on the light emitting members 370 and the partition 361. The common electrode 270 is supplied with the common voltage Vss and is preferably made of a transparent material such as ITO and IZO.

In the above-described OLED display, a switching control electrode 124a connected to a gate line 121, a switching input electrode 173a connected to a data line 171, and a switching output electrode 175a along with a semiconductor island 154a form a switching TFT Qs having a channel formed in the semiconductor island 154a disposed between the switching input electrode 173a and the switching output electrode 175a. Likewise, a driving control electrode 124b connected to a switching output electrode 175a, a driving input electrode 173b connected to a driving voltage line 172, and a driving output electrode 175b connected to a pixel electrode 191 along with a semiconductor island 154b form a driving TFT Qd having a channel formed in the semiconductor island 154b disposed between the driving input electrode 173b and the driving output electrode 175b.

A pixel electrode 191, a light emitting member 370, and the common electrode 270 form an OLED LD having the pixel electrode 191 as an anode and the common electrode 270 as a cathode, or vice versa. Overlapping portions of a storage electrode 127 and a driving voltage line 172 form a storage capacitor Cst.

The OLED display emits light toward the top or bottom of the substrate 110 to display images. A combination of opaque pixel electrodes 191 and a transparent common electrode 270 is employed in a top emission OLED display that emits light toward the top of the substrate 110, and a combination of transparent pixel electrodes 191 and an opaque common electrode 270 is employed in a bottom emission OLED display that emits light toward the bottom of the substrate 110.

Now, a method of manufacturing the display panel shown in FIGS. 2 to 4 is described with reference to FIGS. 5 to 21 as well as FIGS. 2 to 4.

Figure 5:
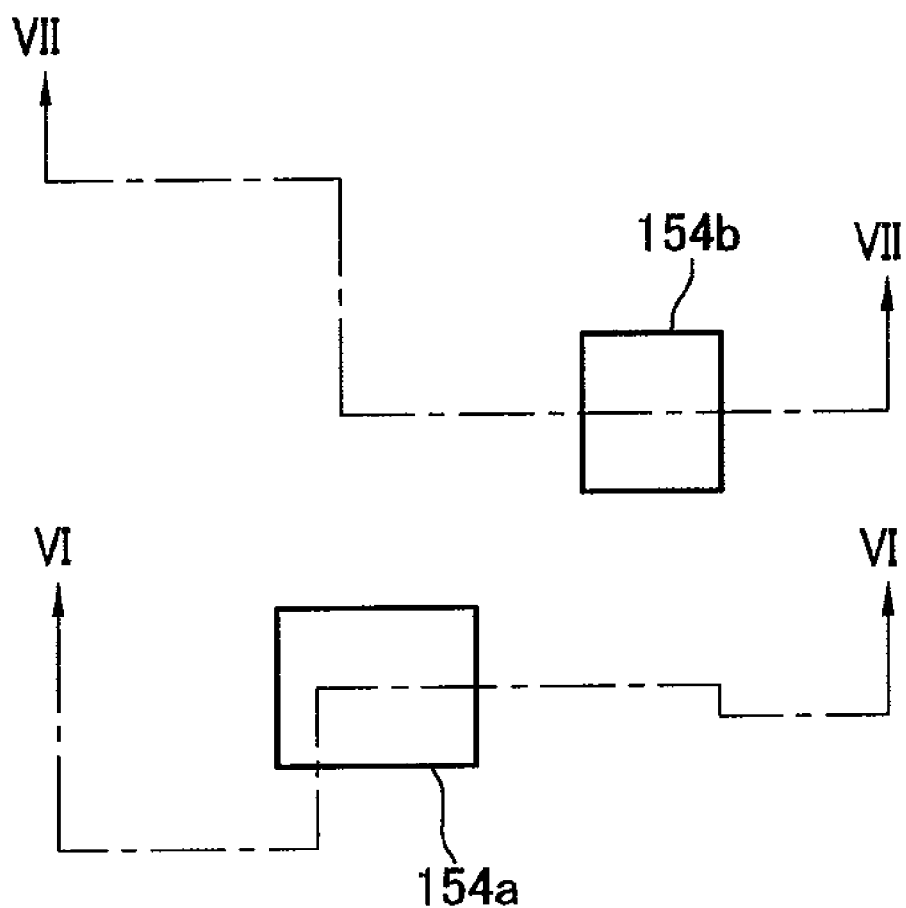
FIGS. 5, 10, 13, 16 and 19 are layout views of a TFT array panel shown in FIGS. 2, 3, and 4 in intermediate steps of a manufacturing method thereof according to an embodiment of the present invention.
Figure 6:
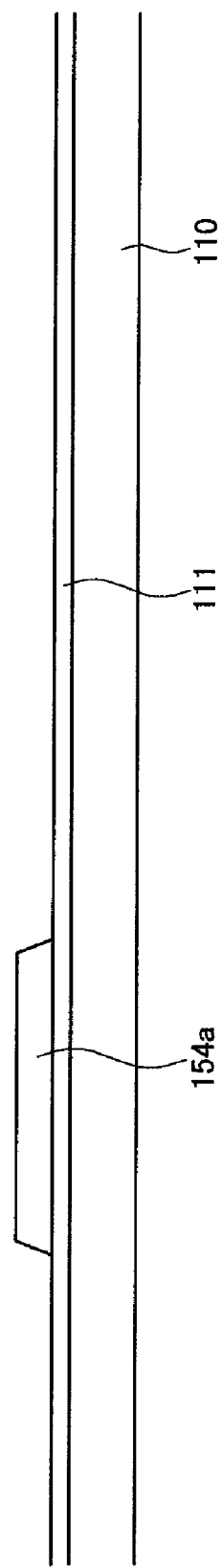
FIGS. 6 and 7 are sectional views of the TFT array panel shown in FIG. 5 taken along the lines VI-VI and VII-VII.
Figure 7:
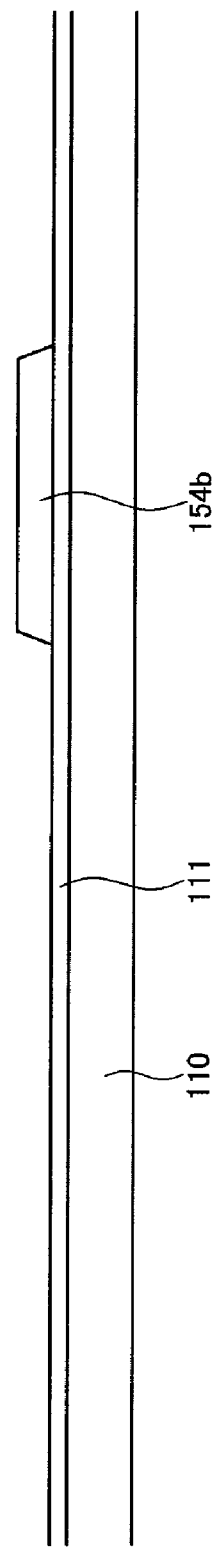
Figure 8:
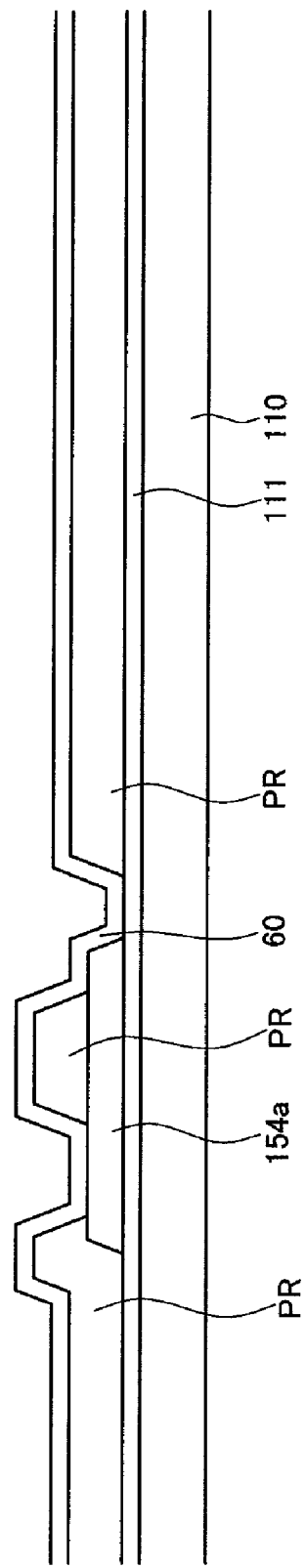
FIGS. 8 and 9 are sectional views of the TFT array panel in the step following the step shown in FIGS. 6 and 7, respectively.
Figure 9:
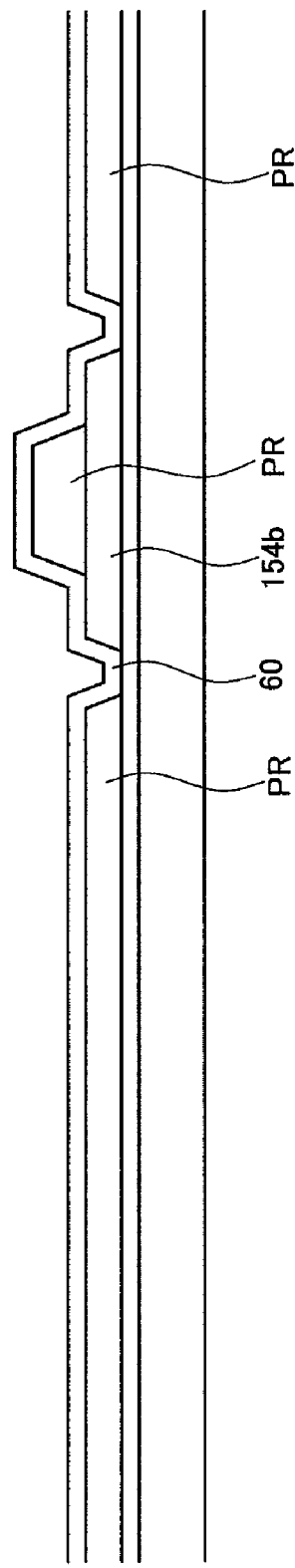
Figure 10:
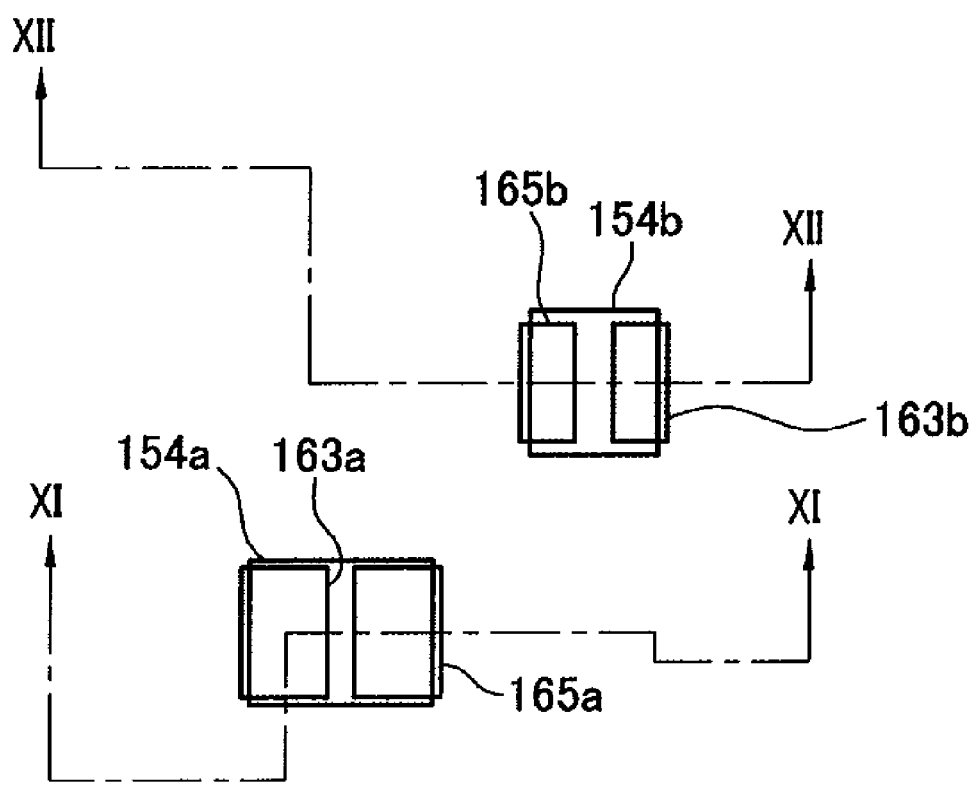
Figure 11:
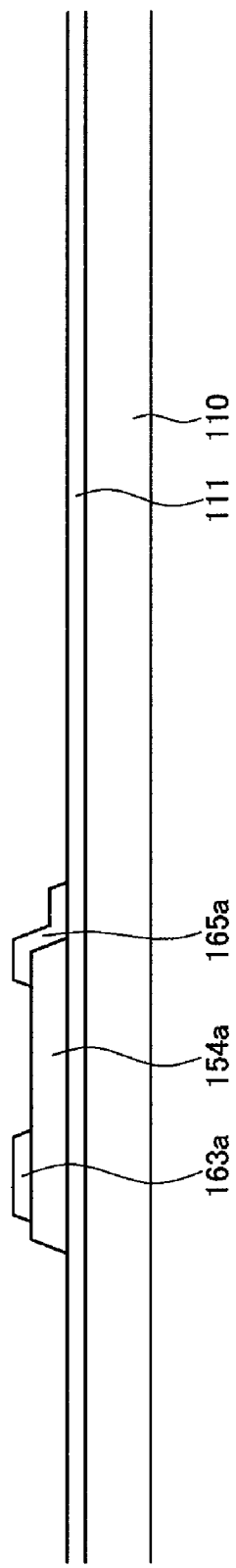
FIGS. 11 and 12 are sectional views of the TFT array panel shown in FIG. 10 taken along the lines XI-XI and XII-XII, respectively.
Figure 12:
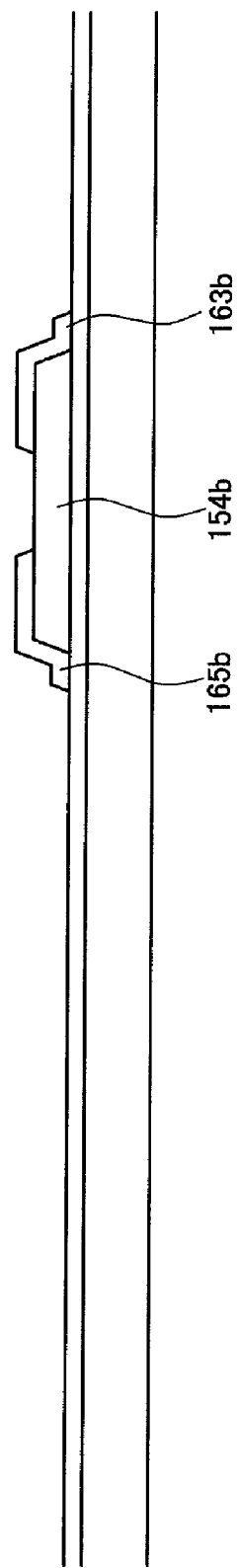
Figure 13:
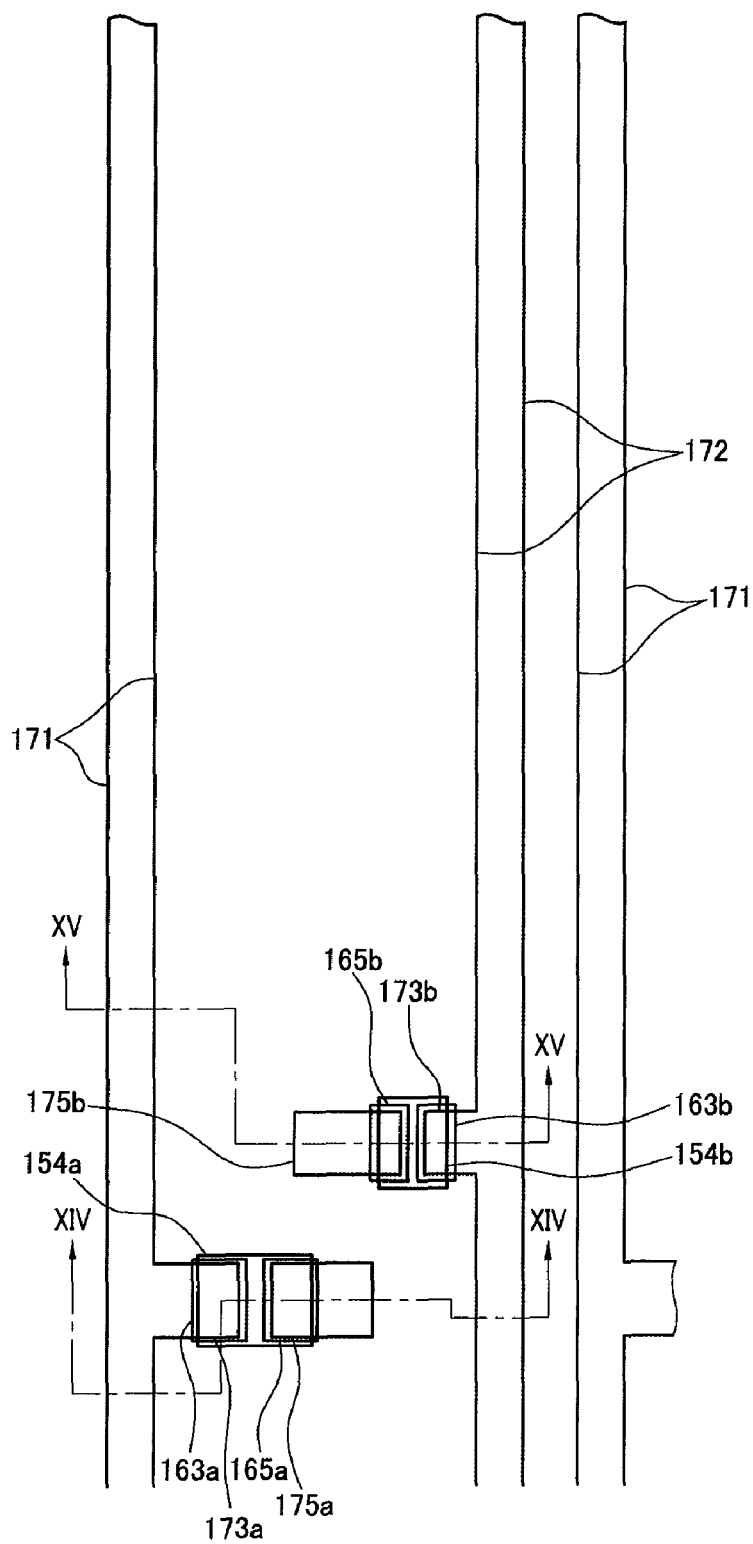
Figure 14:
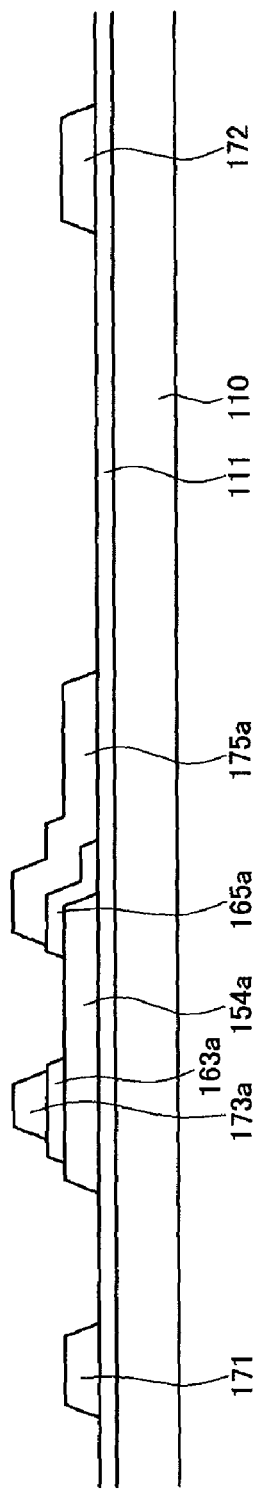
FIGS. 14 and 15 are sectional views of the TFT array panel shown in FIG. 13 taken along the lines XIV-XIV and XV-XV, respectively.
Figure 15:
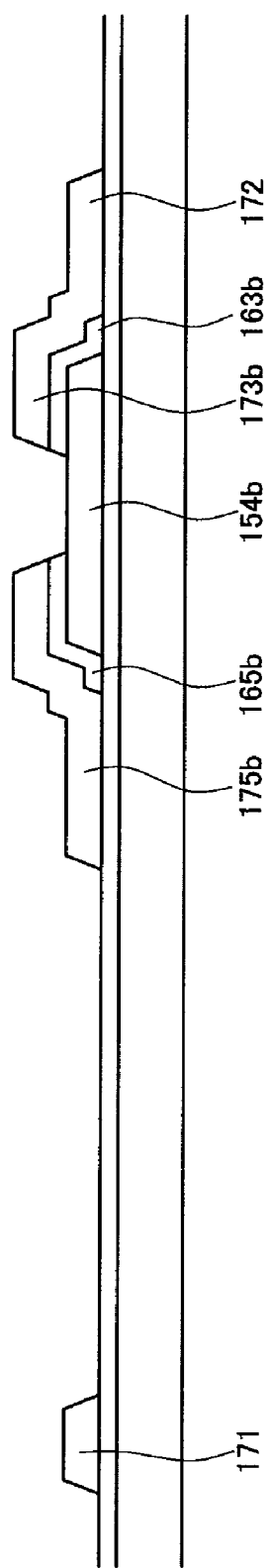
Figure 16:
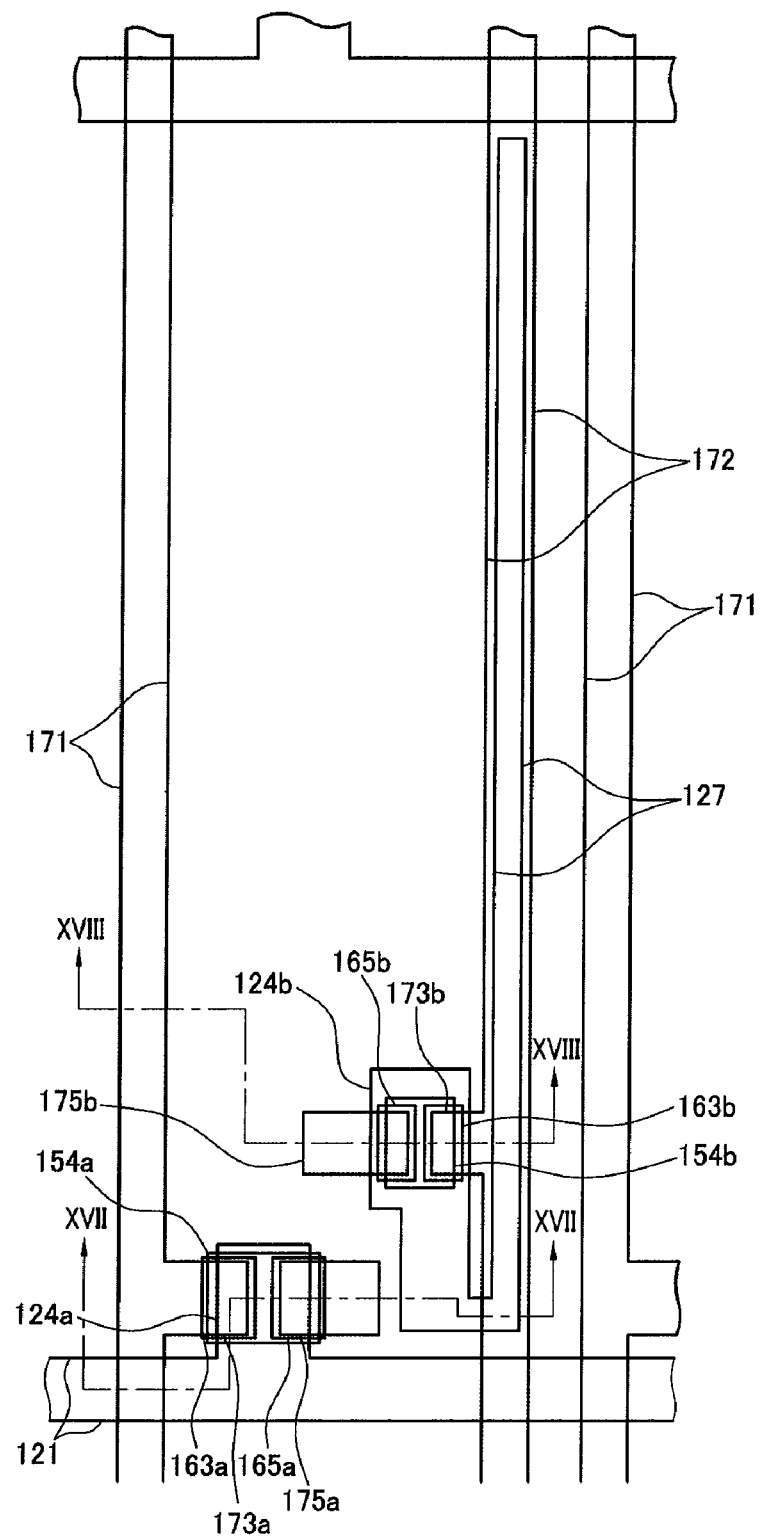
Figure 17:
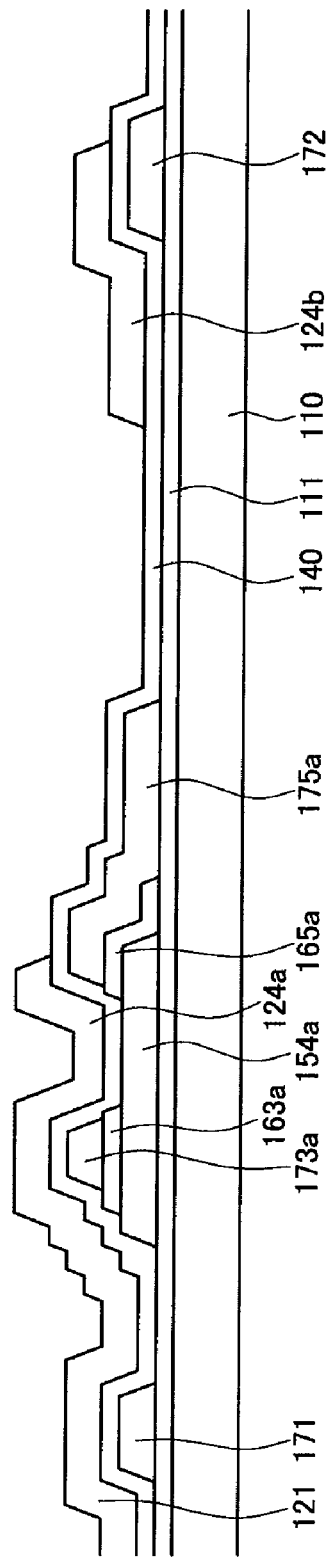
FIGS. 17 and 18 are sectional views of the TFT array panel shown in FIG. 16 taken along the lines XVII-XVII and XVIII-XVIII, respectively.
Figure 18:
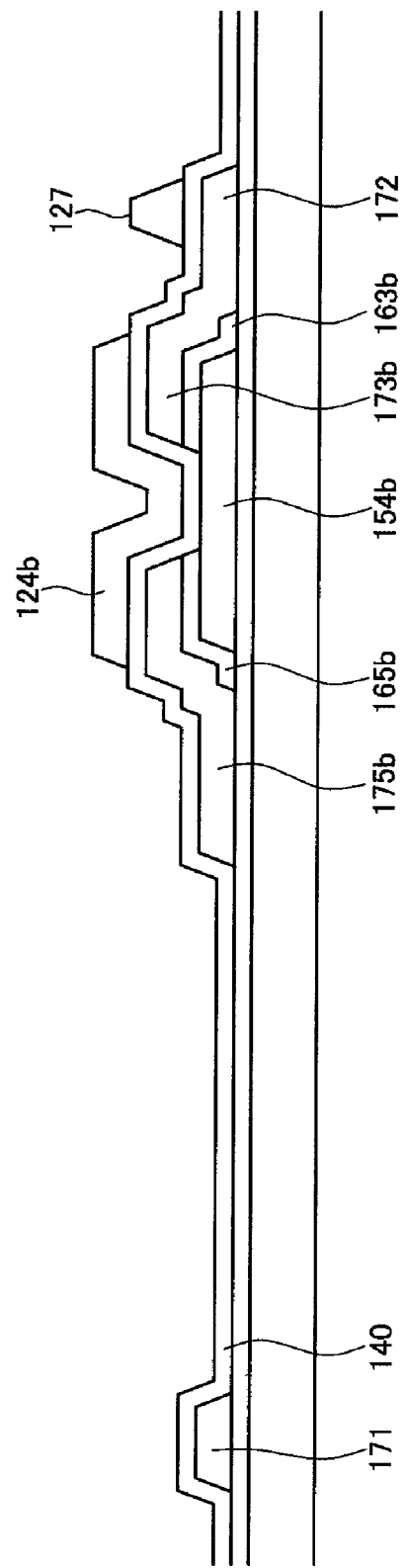
Figure 19:
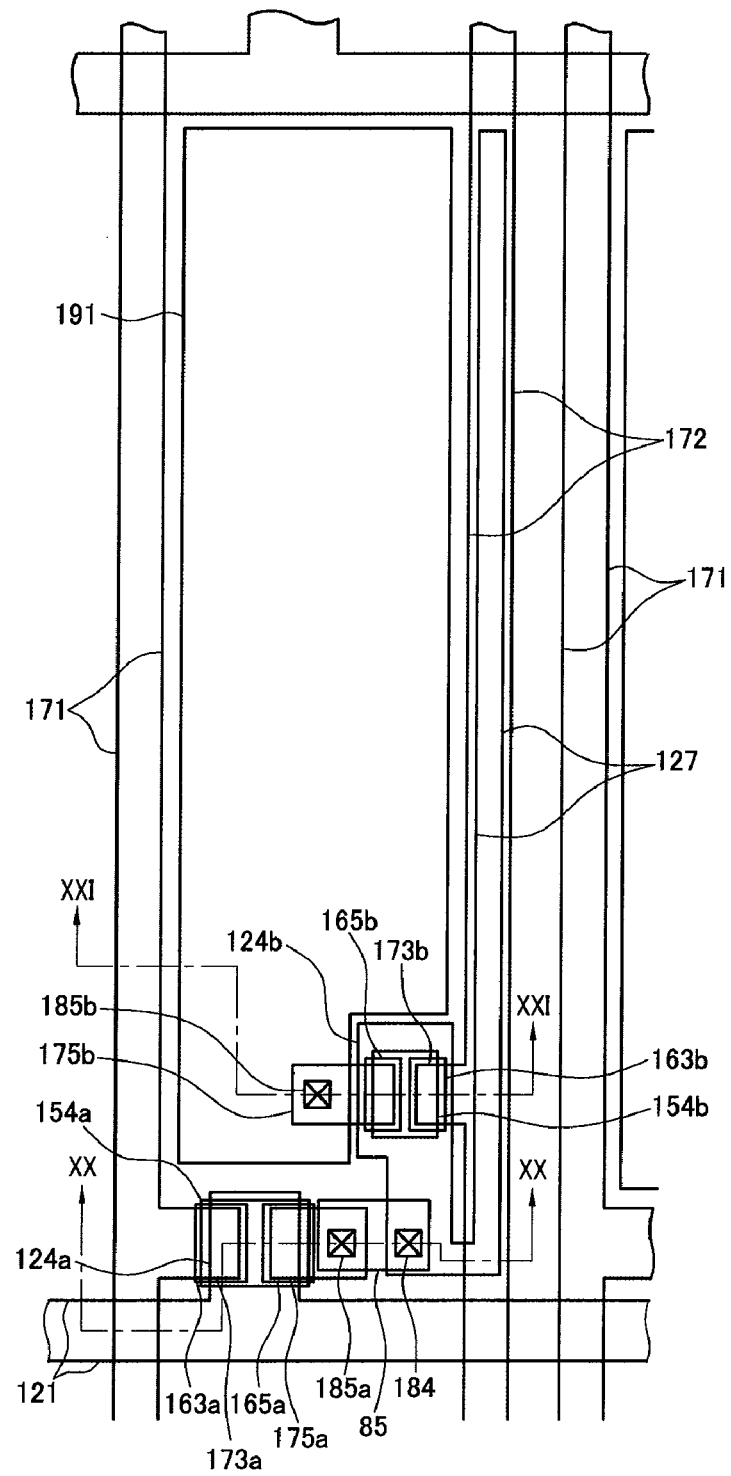
Figure 20:
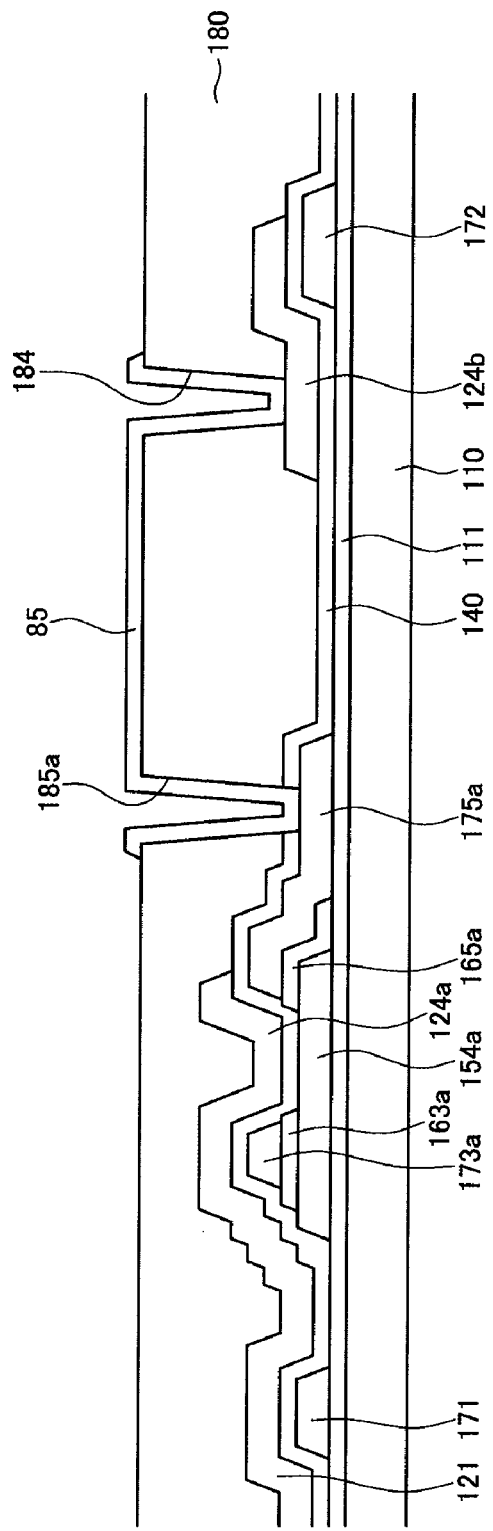
FIGS. 20 and 21 are sectional views of the TFT array panel shown in FIG. 19 taken along the lines XX-XX and XXI-XXI, respectively.
Figure 21:
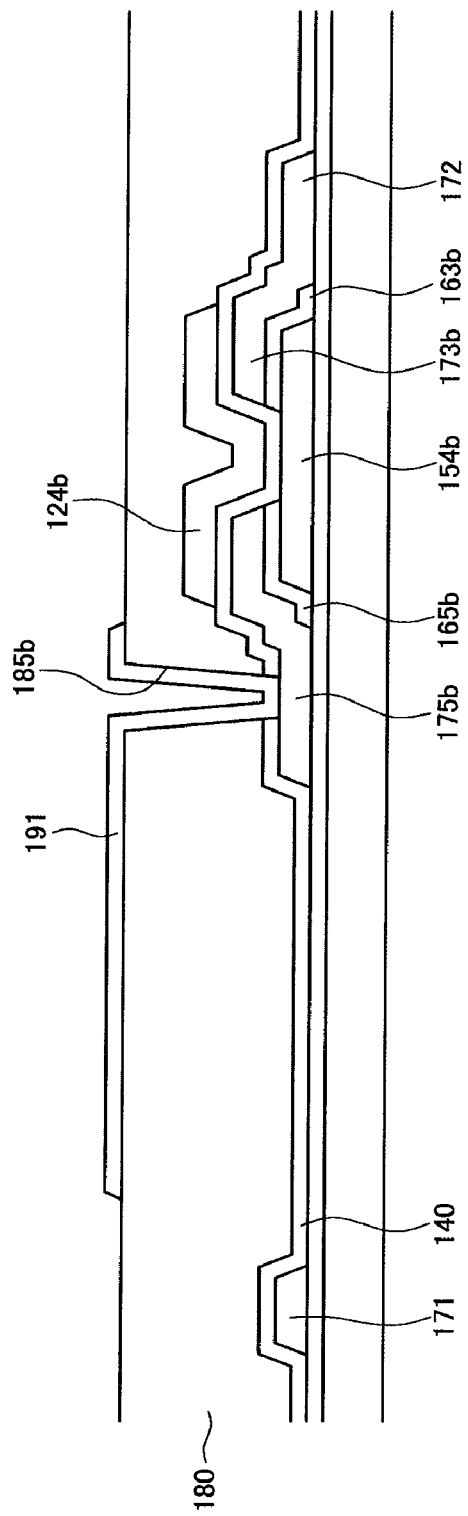

FIGS. 5, 10, 13, 16 and 19 are layout views of a TFT array panel shown in FIGS. 2, 3, and 4 in intermediate stages of a manufacturing method thereof according to an embodiment of the present invention, FIGS. 6 and 7 are sectional views of the TFT array panel shown in FIG. 5 taken along the lines VI-VI and VII-VII, FIGS. 8 and 9 are sectional views of the TFT array panel in the stage following the stage shown in FIGS. 6 and 7, respectively, FIGS. 11 and 12 are sectional views of the TFT array panel shown in FIG. 10 taken along the lines XI-XI and XII-XII, respectively, FIGS. 14 and 15 are sectional views of the TFT array panel shown in FIG. 13 taken along the lines XIV-XIV and XV-XV, respectively, FIGS. 17 and 18 are sectional views of the TFT array panel shown in FIG. 16 taken along the lines XVII-XVII and XVIII-XVIII, respectively, and FIGS. 20 and 21 are sectional views of the TFT array panel shown in FIG. 19 taken along the lines XX-XX and XXI-XXI, respectively.

As shown in FIGS. 5 to 7, a blocking film 111 preferably made of silicon oxide ($SiO_2$) or silicon nitride ($SiN_x$) is formed on an insulating substrate 110 such as transparent glass, quartz, or sapphire.

Next, amorphous silicon is deposited and then crystallized to form a polycrystalline silicon layer. To crystallize the amorphous silicon, excimer laser annealing (ELA), solid phase crystallization (SPC), or metal induced lateral crystallization (MILC) may be used, and it is preferable that the solid phase crystallization is used.

Next, the polycrystalline silicon layer is patterned by photolithography to form a plurality of switching and driving semiconductor islands 154a and 154b.

Next, as shown in FIGS. 8 and 9, a photoresist film PR is formed on the switching and driving semiconductor islands 154a and 154b. To define the region on which an ohmic contact layer is formed, the photoresist PR is removed in the region where an ohmic contact layer is formed, and the photoresist PR covers the remaining portion including where a channel region is disposed.

Then, an amorphous silicon layer 60 doped with impurities is deposited on the photoresist film PR with the thickness of about 500 Å. It is preferable that the amorphous silicon layer 60 is deposited at a temperature of less than 150 degrees to prevent the photoresist film PR from being hardened.

Next, as shown in FIGS. 10 to 12, the amorphous silicon layer 60 disposed on the photoresist film PR and the photoresist film PR are removed by a lift-off method to form a plurality of pairs of ohmic contacts 163a and 165a and a plurality of pairs of ohmic contacts 163b and 165b, respectively.

Then, thermal treatment is executed at a temperature of about 400° C. to improve contact characteristics between the ohmic contacts 163a, 165a, 163b, and 165b, and the semiconductor islands 154a and 154b.

Thereafter, HF cleaning and plasma treatment are executed in order to stabilize the exposed surfaces of the semiconductor islands 154a and 154b. Here, the plasma treatment is carried out under the conditions of about 200 Watt/12,000 $mm^2$ power and about 1000-3000 mT pressure with a flow rate of about 1000-3000 sccm (standard cubic centimeters per minute) for 90-180 seconds.

In this manufacturing method according to the present invention, the ohmic contacts 163a, 165a, 163b, and 165b are formed by a lift-off method such that the thickness of the semiconductor islands 154a and 154b may be uniformly formed. That is to say, the portion of the semiconductor islands 154a and 154b that are covered by the ohmic contacts 163a, 165a, 163b, and 165b and the rest of the semiconductor islands 154a and 154b except for the aforementioned portion have the same uniform thickness without steps. In general, an undoped silicon layer and a doped silicon layer are sequentially formed and the doped silicon layer is partially etched to form the ohmic contacts. However, the portion of the undoped silicon layer is also etched when etching the doped silicon layer in this manufacturing method such that the portion of the semiconductors that is covered by the ohmic contacts and the rest of the semiconductors have different thicknesses, and accordingly steps are formed between the two portions.

Next, as shown in FIGS. 13 to 15, a conductive layer is sputtered or deposited by CVD and photo-etched to form a plurality of data conductors that include a plurality of data lines 171 including a plurality of switching input electrodes 173a, a plurality of driving voltage lines 172 including driving input electrodes 173b, and a plurality of switching and driving output electrodes 175a and 175b.

Next, as shown in FIGS. 16 to 18, a gate insulating layer 140 made of silicon nitride is formed on the data conductors 171, 172, 175a, and 175b.

Thereafter, a plurality of gate conductors that include a plurality of gate lines 121 including switching control electrodes 124a and a plurality of driving control electrodes 124b including a plurality of storage electrodes 127, are formed on the gate insulating layer 140.

Referring to FIGS. 19 to 21, a passivation layer 180 is deposited by CVD or printing, etc., and patterned along with the gate insulating layer 140 to form a plurality of contact holes 184, 185a, and 185b on the gate conductors 121 and 124b.

Next, a transparent conductive film is deposited on the passivation layer 180 by sputtering, etc., and is photo-etched to form a plurality of pixel electrodes 191 and a plurality of connecting members 85.

Referring to FIGS. 2 to 4, a photosensitive organic insulator is spin-coated, and exposed and developed to form a partition 361 having openings 365 partly exposing the pixel electrodes 191.

Next, a plurality of organic light emitting members 370 including an electron transport layer, a hole transport layer, and an emitting layer are formed on the pixel electrodes 191 in the openings 365. The organic light emitting members 370 may be formed by a solution process such as inkjet printing and evaporation, and it is preferable that an inkjet head be used to deposit the solvent in the openings 365 during the inkjet printing and the drying process follow the formation of each layer.

Next, a common electrode 270 is formed on the organic light emitting members 370 and the partition 361.

In the manufacturing method of the organic light emitting diode display according to the present invention, because the ohmic contacts 163a, 165a, 163b, and 165b are formed by the lift-off method, the intervals between the pairs of the ohmic contacts 163a, 165a, 163b, and 165b are different from the intervals between the switching input electrode 163a and the switching output electrode 165a, or the intervals between the driving input electrode 163b and the driving output electrode 165b.

Figure 22:
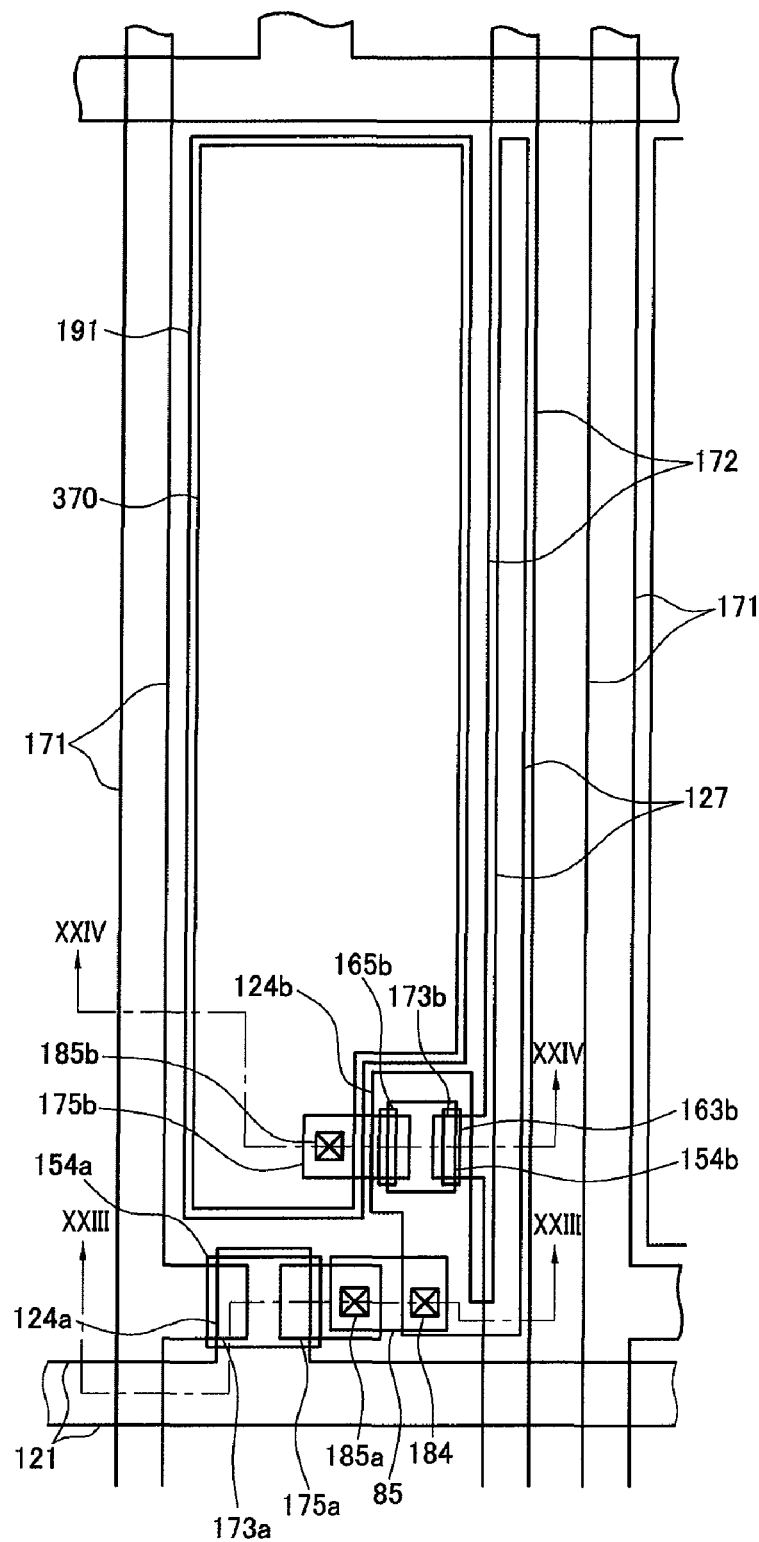
FIG. 22 is an exemplary layout view of a TFT array panel for an OLED according to another embodiment of the present invention.
Figure 23:
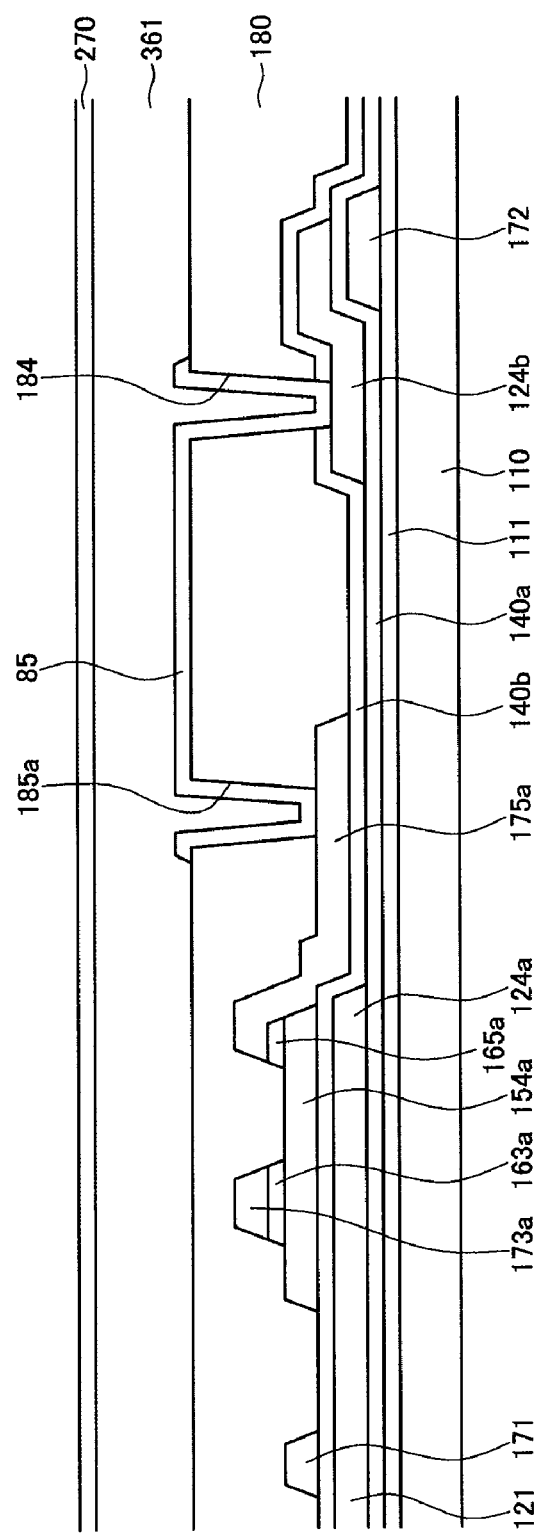
FIGS. 23 and 24 are sectional views of the TFT array panel shown in FIG. 22, taken along the lines XXIII-XXIII and XXIV-XXIV, respectively.
Figure 24:
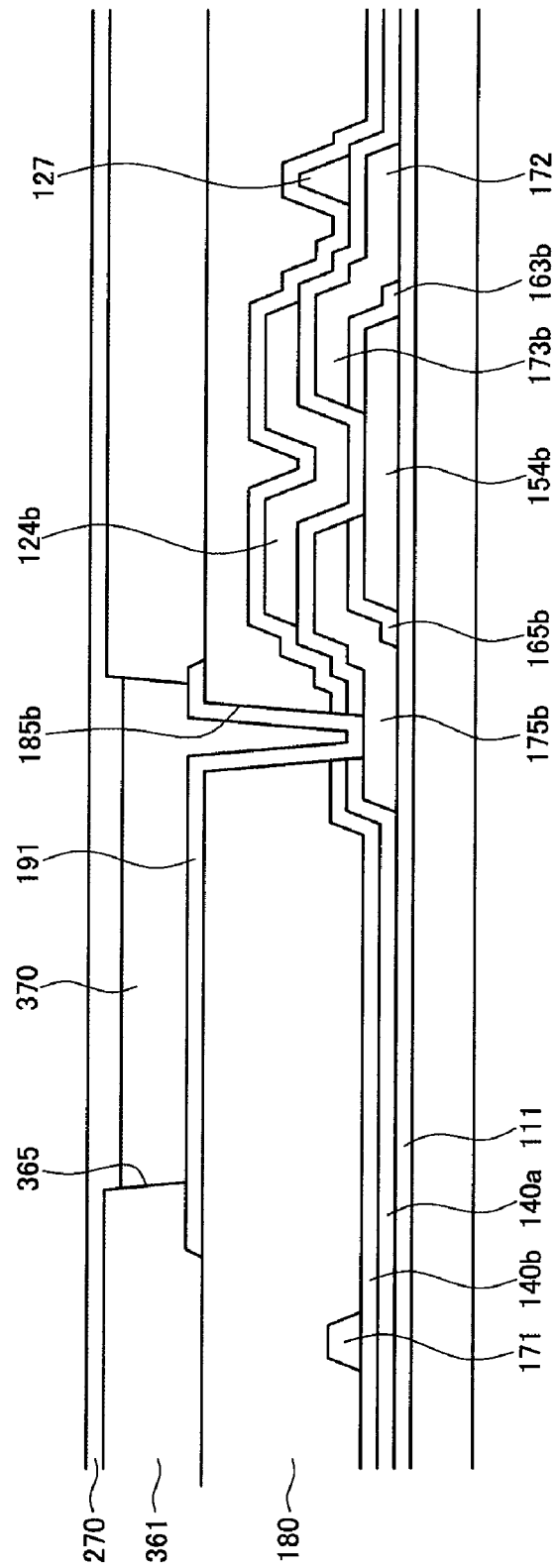

Referring to FIGS. 22 to 24, a detailed structure of the OLED display according to another embodiment of the present invention will be described in detail.

The description of the same layered structures as those shown in FIGS. 2 to 4 is simplified in the description of the OLED according to this embodiment.

FIG. 22 is an exemplary layout view of a TFT array panel for an OLED according to another embodiment of the present invention, and FIGS. 23 and 24 are sectional views of the TFT array panel shown in FIG. 22, taken along the lines XXIII-XXIII and XXIV-XXIV, respectively.

A blocking film 111 is formed on an insulating substrate 110 such as transparent glass, quartz, or sapphire, and a plurality of driving semiconductor islands 154b preferably made of hydrogenated amorphous silicon (abbreviated to "a-Si") or polysilicon are formed thereon.

A plurality of pairs of ohmic contacts 163b and 165b are respectively formed on the driving semiconductor islands 154b, respectively. The ohmic contacts 163b and 165b are preferably made of silicide or n+ hydrogenated a-Si heavily doped with an n-type impurity such as phosphorous. The ohmic contacts 163b and 165b are located in pairs on the driving semiconductor islands 154b.

A plurality of driving voltage lines 172 including a plurality of driving input electrodes 173b, and a plurality of driving output electrodes 175b are formed on the ohmic contacts 163b and 165b and the blocking layer 111.

A first gate insulating layer 140a preferably made of silicon nitride (SiNx) or silicon oxide (SiOx) is formed on the driving voltage lines 172 and the driving output electrodes 175b.

A plurality of gate conductors that include a plurality of gate lines 121 including switching control electrodes 124a, and a plurality of driving control electrodes 124b, are formed on the first gate insulating layer 140a.

Each of the driving control electrodes 124b is separated from the gate lines 121 and includes a storage electrode 127, and the storage electrodes 127 overlap the driving voltage lines 172.

The gate conductors 121 and 124b are preferably made of the same material as that of FIGS. 2 to 4.

A second gate insulating layer 140b preferably made of silicon nitride ($SiN_x$) or silicon oxide ($SiO_x$) is formed on the gate conductors 121 and 124b.

A plurality of switching semiconductor islands 154a made of amorphous silicon or polycrystalline silicon are formed on the second gate insulating layer 140b. The switching semiconductor islands 154a are disposed on the switching control electrodes 124a.

A plurality of pairs of ohmic contacts 163a and 165a are respectively formed on the switching semiconductor islands 154a. The ohmic contacts 163a and 165a are preferably made of silicide or n+ hydrogenated a-Si heavily doped with an n-type impurity such as phosphorus. The ohmic contacts 163a and 165a are located in pairs on the switching semiconductor islands 154a.

A plurality of data lines 171 and a plurality of switching output electrodes 175a are formed on the second gate insulating layer 140b and the ohmic contacts 163a and 165a.

The switching output electrodes 175a are separated from the data lines 171 and opposite the switching input electrodes 173a with respect to the switching control electrodes 124a.

A passivation layer 180 made of an organic material or an inorganic material is formed on the second gate insulating layer 140b, the data lines 171, and the switching output electrodes 175a.

The passivation layer 180 has a plurality of contact holes 185b exposing the driving output electrodes 175b along with the first and second gate insulating layers 140a and 140b. Also, the passivation layer 180 has a plurality of contact holes 185a exposing the switching output electrodes 175a, and the passivation layer 180 and the second gate insulating layer 140b have a plurality of contact holes 184 exposing the driving control electrodes 124b.

A plurality of pixel electrodes 191 and a plurality of connection members 85 are formed on the passivation layer 180, and they are preferably made of a transparent conductor such as ITO or IZO, or a reflective conductor such as Al, Ag, or alloys thereof.

The pixel electrodes 191 are connected to the driving output electrodes 175b through the contact holes 185b. The connecting members 85 are connected to the driving control electrodes 124b and the switching output electrodes 175a through the contact holes 184 and 185a, respectively.

A partition 361 to define openings 365 is formed on the passivation layer 180, and a plurality of light emitting members 370 are formed on the pixel electrodes 191 and confined in the openings 365 defined by the partition 361. A common electrode 270 is formed on the light emitting members 370 and the partition 361.

Now, a method of manufacturing the display panel shown in FIGS. 22 to 24 is described with reference to FIGS. 25 to 47 as well as FIGS. 22 to 24.

Figure 25:
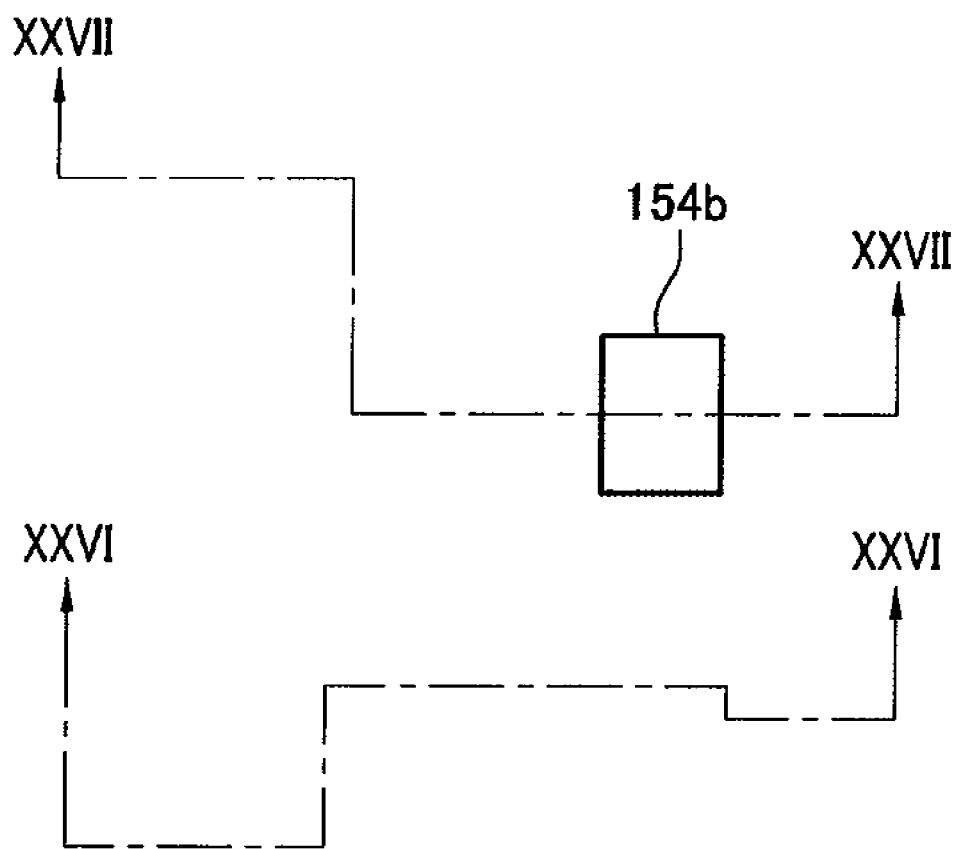
FIGS. 25, 30, 33, 36, 39, 42 and 45 are layout views of the TFT array panel shown in FIGS. 22 to 24 in intermediate steps of a manufacturing method thereof according to an embodiment of the present invention.
Figure 26:
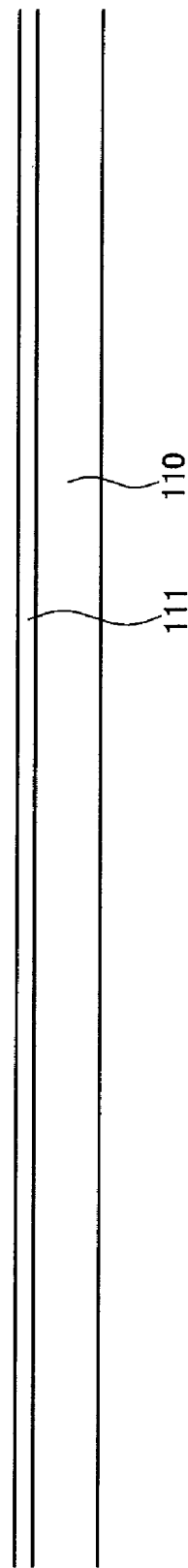
FIGS. 26 and 27 are sectional views of the TFT array panel shown in FIG. 25 taken along the lines XXVI-XXVI and XXVII-XXVII.
Figure 27:
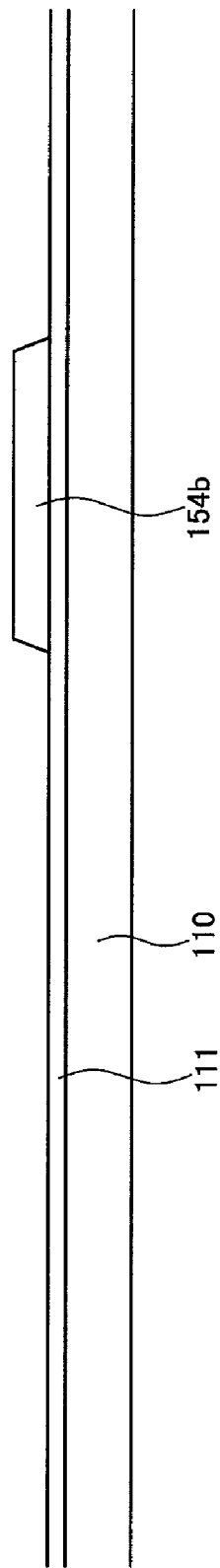
Figure 28:
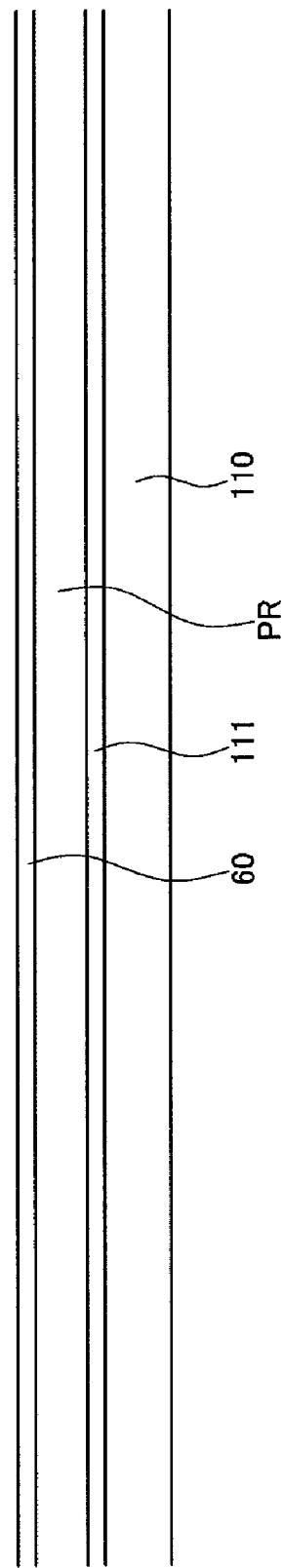
FIGS. 28 and 29 are sectional views of the TFT array panel in the step following the step shown in FIGS. 26 and 27, respectively.
Figure 29:
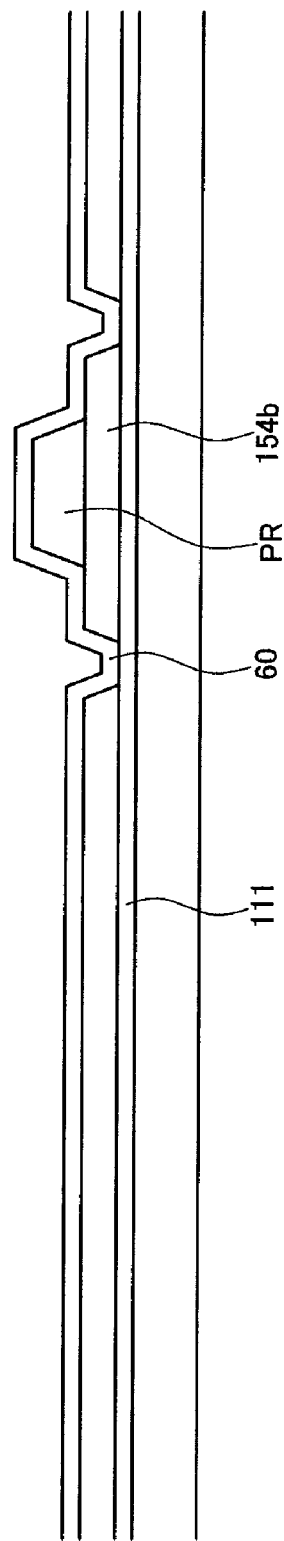
Figure 30:
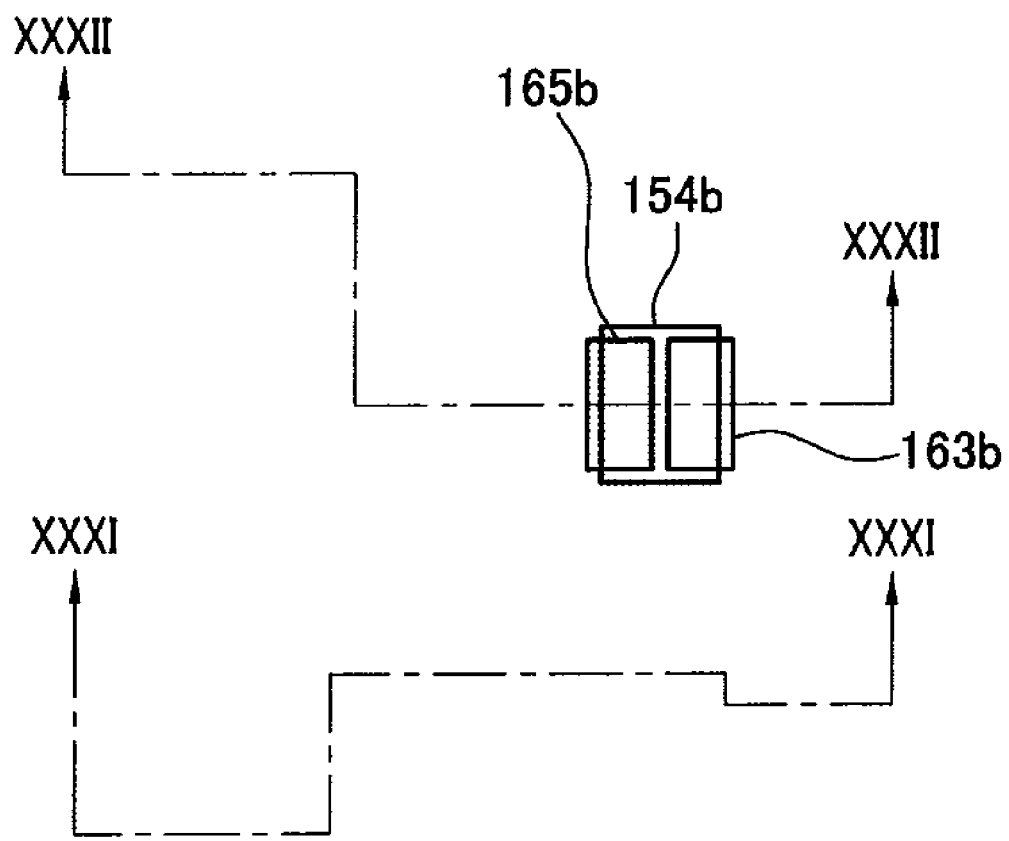
Figure 31:
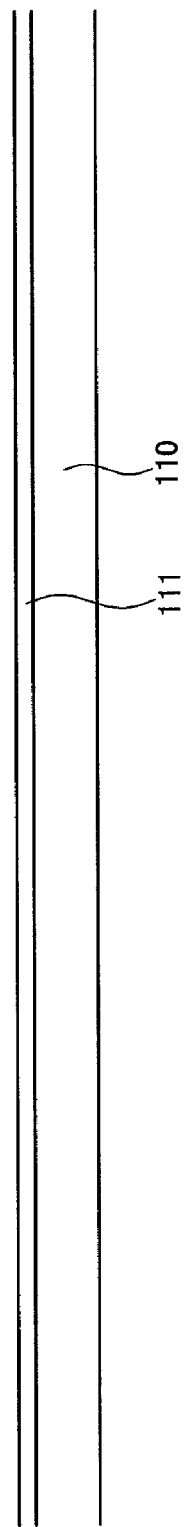
FIGS. 31 and 32 are sectional views of the TFT array panel shown in FIG. 30 taken along the lines XXXI-XXXI and XXXII-XXXII, respectively.
Figure 32:
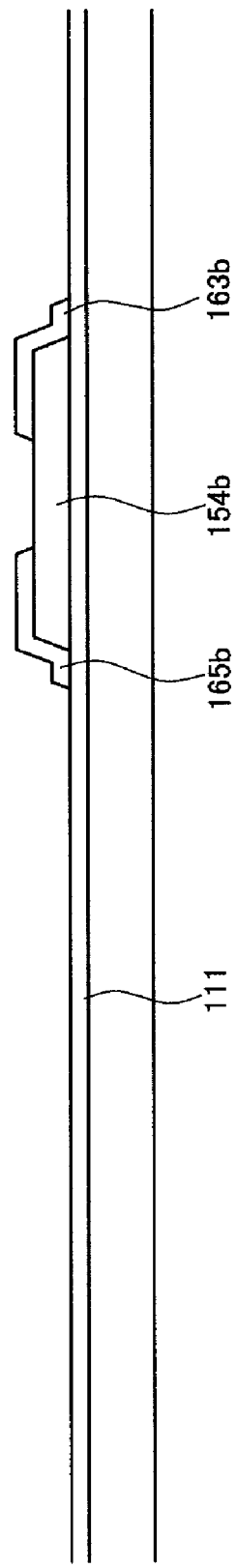
Figure 33:
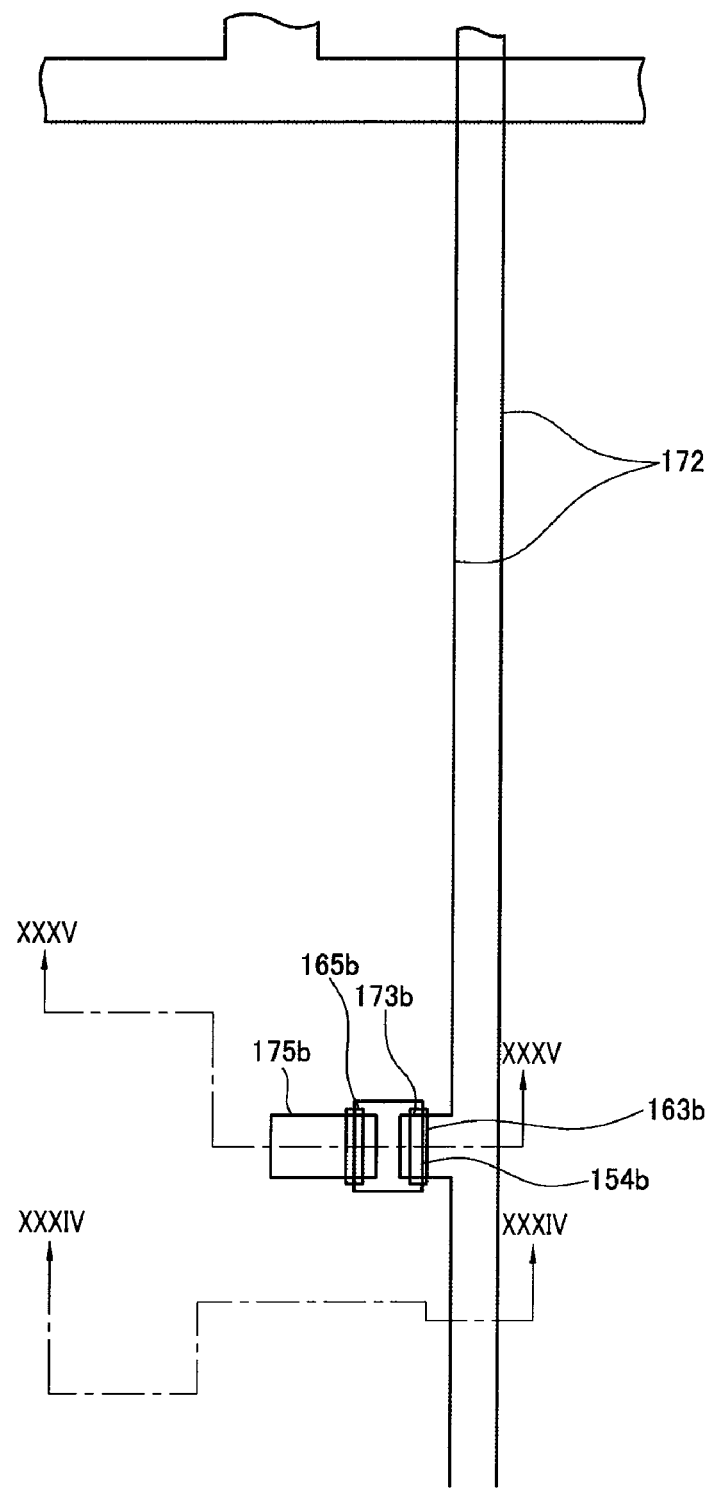
Figure 34:
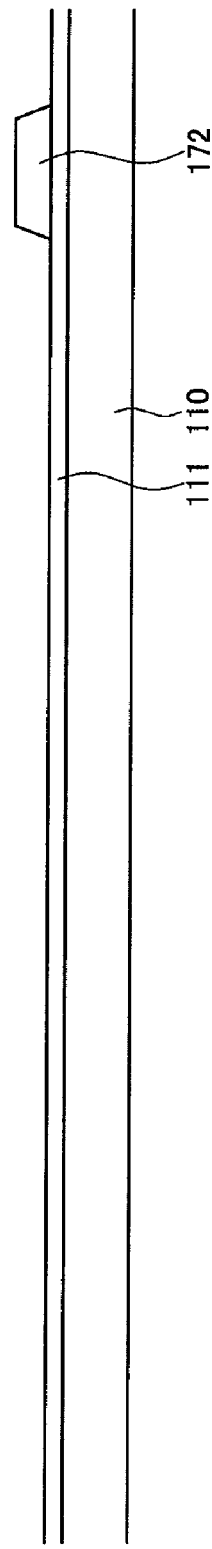
FIGS. 34 and 35 are sectional views of the TFT array panel shown in FIG. 33 taken along the lines XXXIV-XXXIV and XXXV-XXXV, respectively.
Figure 35:
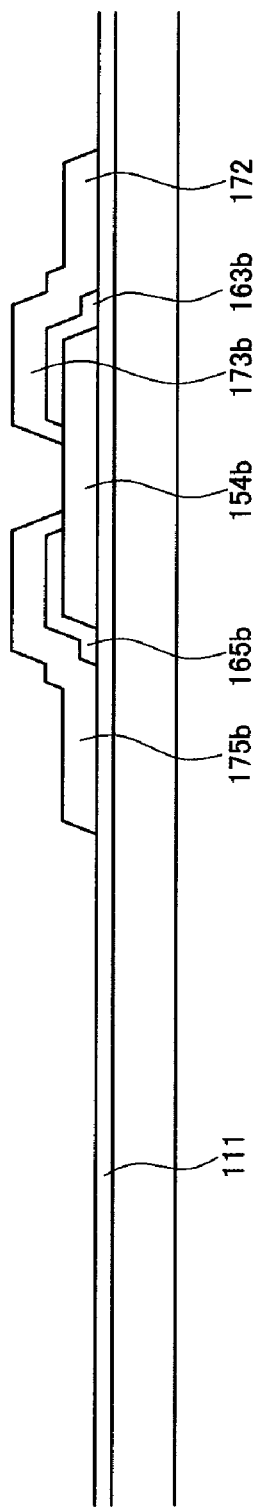
Figure 36:
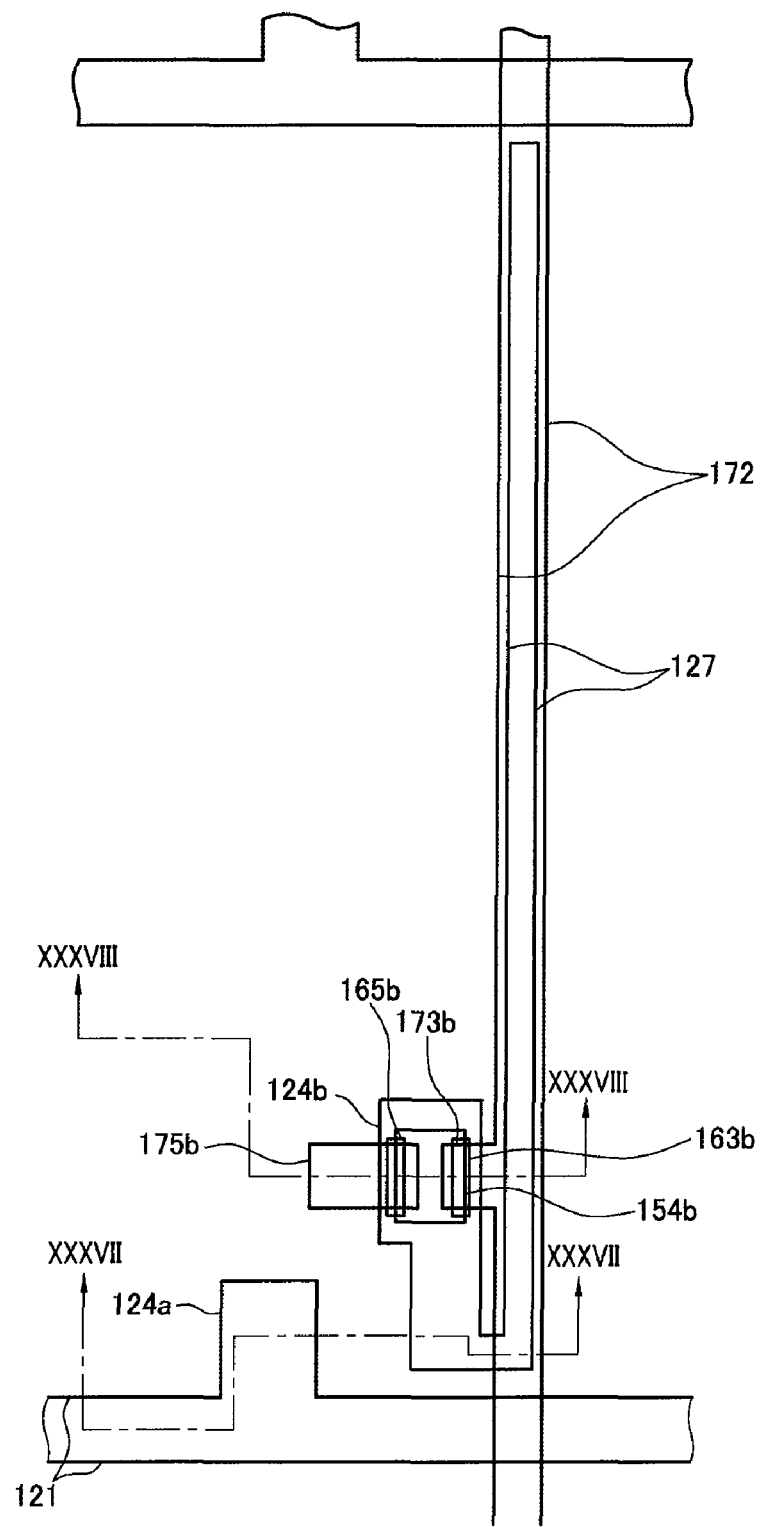
Figure 37:
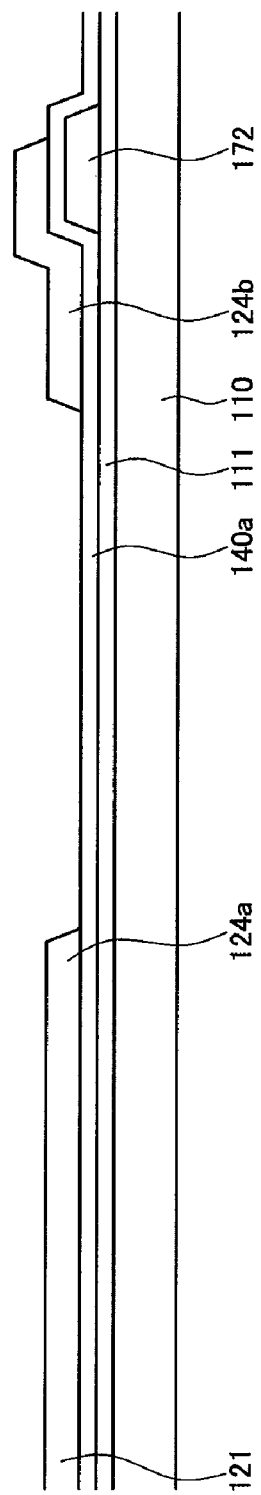
FIGS. 37 and 38 are sectional views of the TFT array panel shown in FIG. 36 taken along the lines XXXVII-XXXVII and XXXVIII-XXXVIII, respectively.
Figure 38:
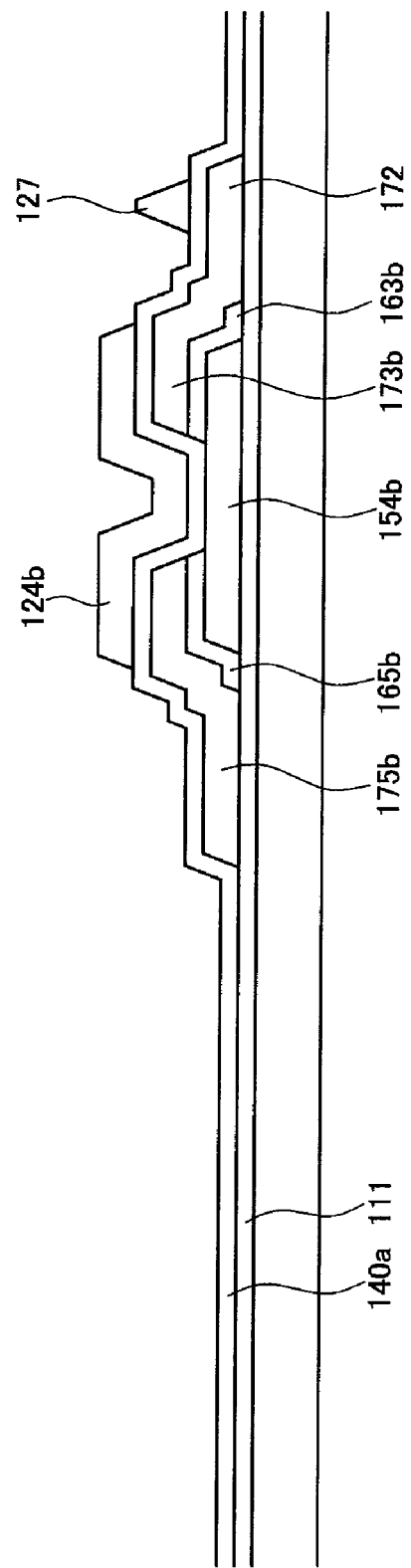
Figure 39:
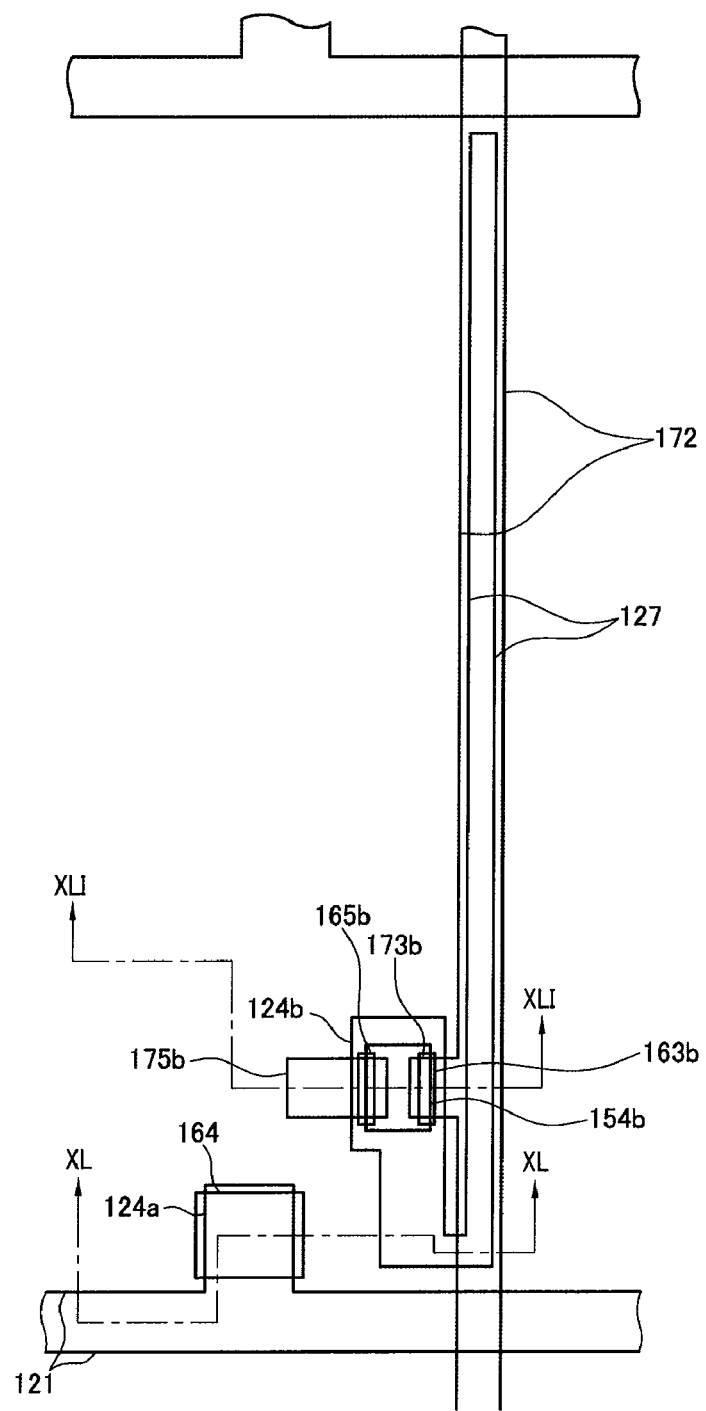
Figure 40:
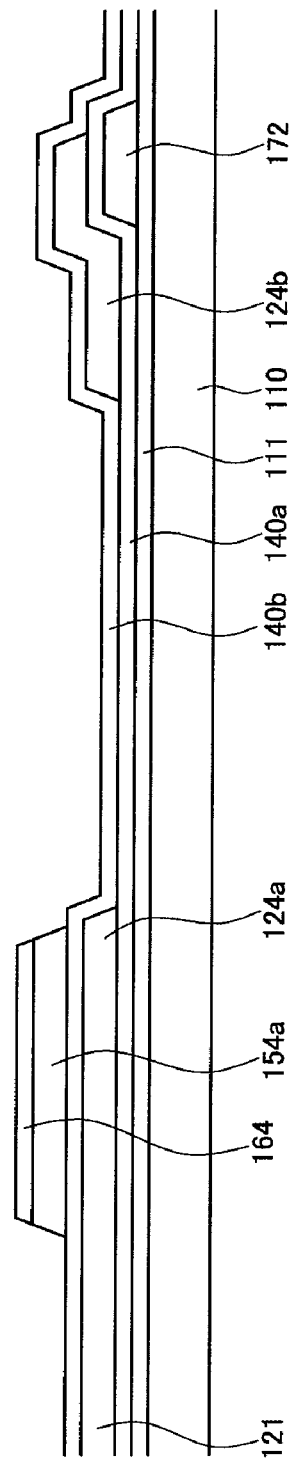
FIGS. 40 and 41 are sectional views of the TFT array panel shown in FIG. 39 taken along the lines XL-XL and XLI-XLI, respectively.
Figure 41:
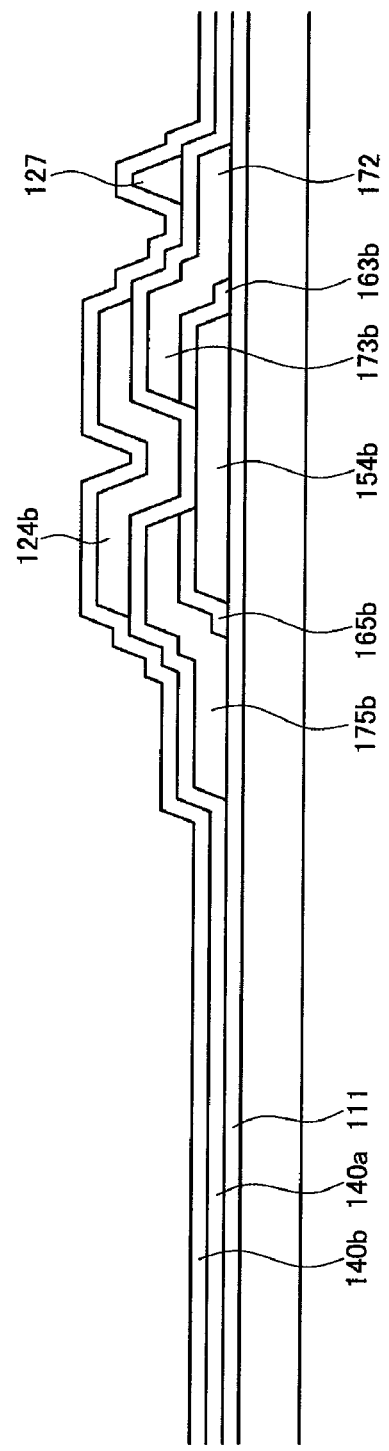
Figure 42:
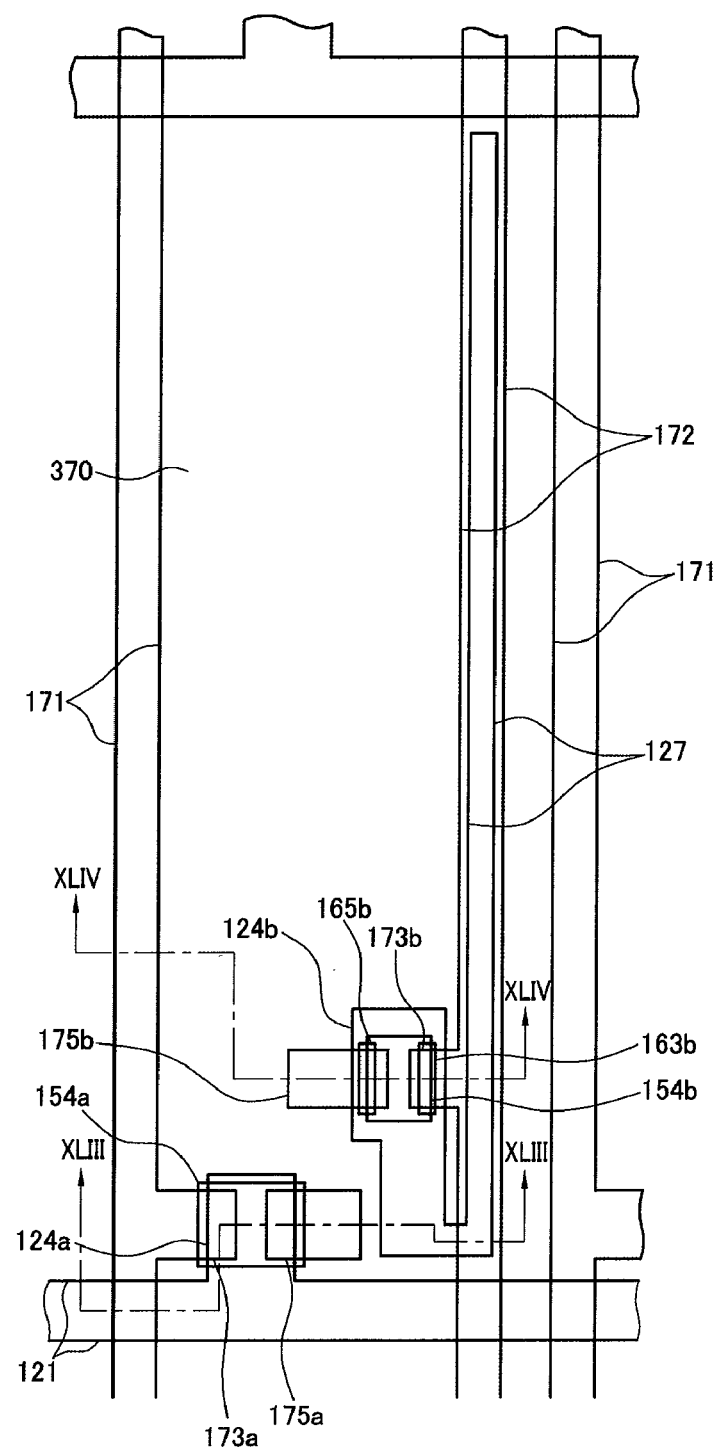
Figure 43:
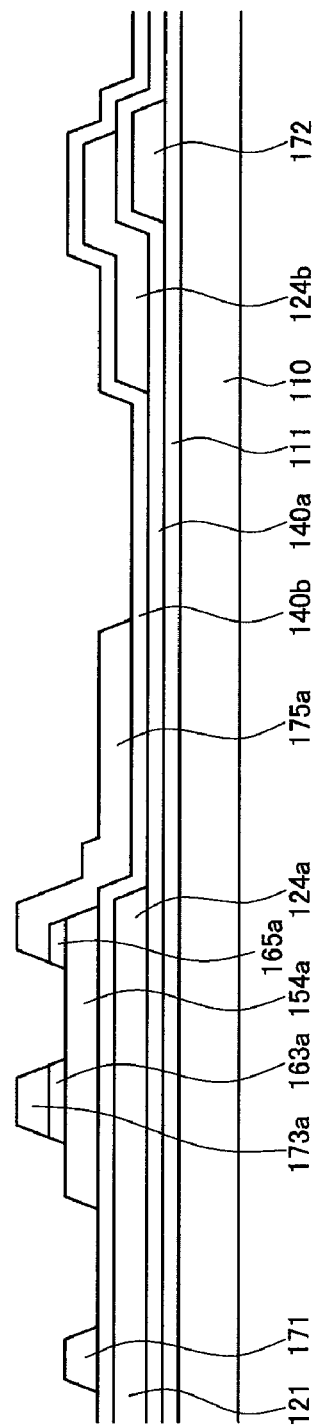
FIGS. 43 and 44 are sectional views of the TFT array panel shown in FIG. 42 taken along the lines XLIII-XLIII and XLIV-XLIV, respectively.
Figure 44:
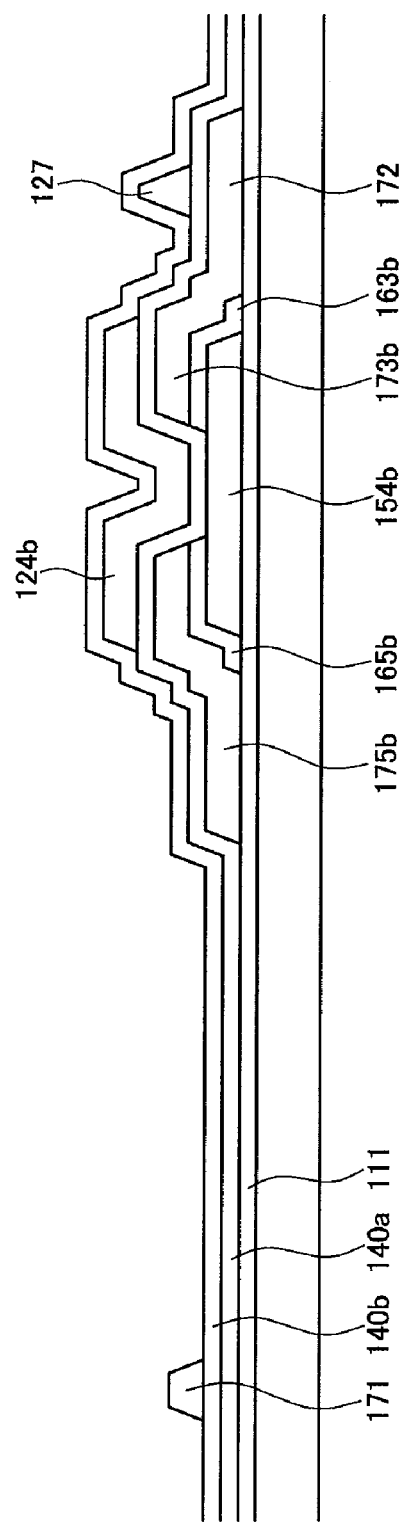
Figure 45:
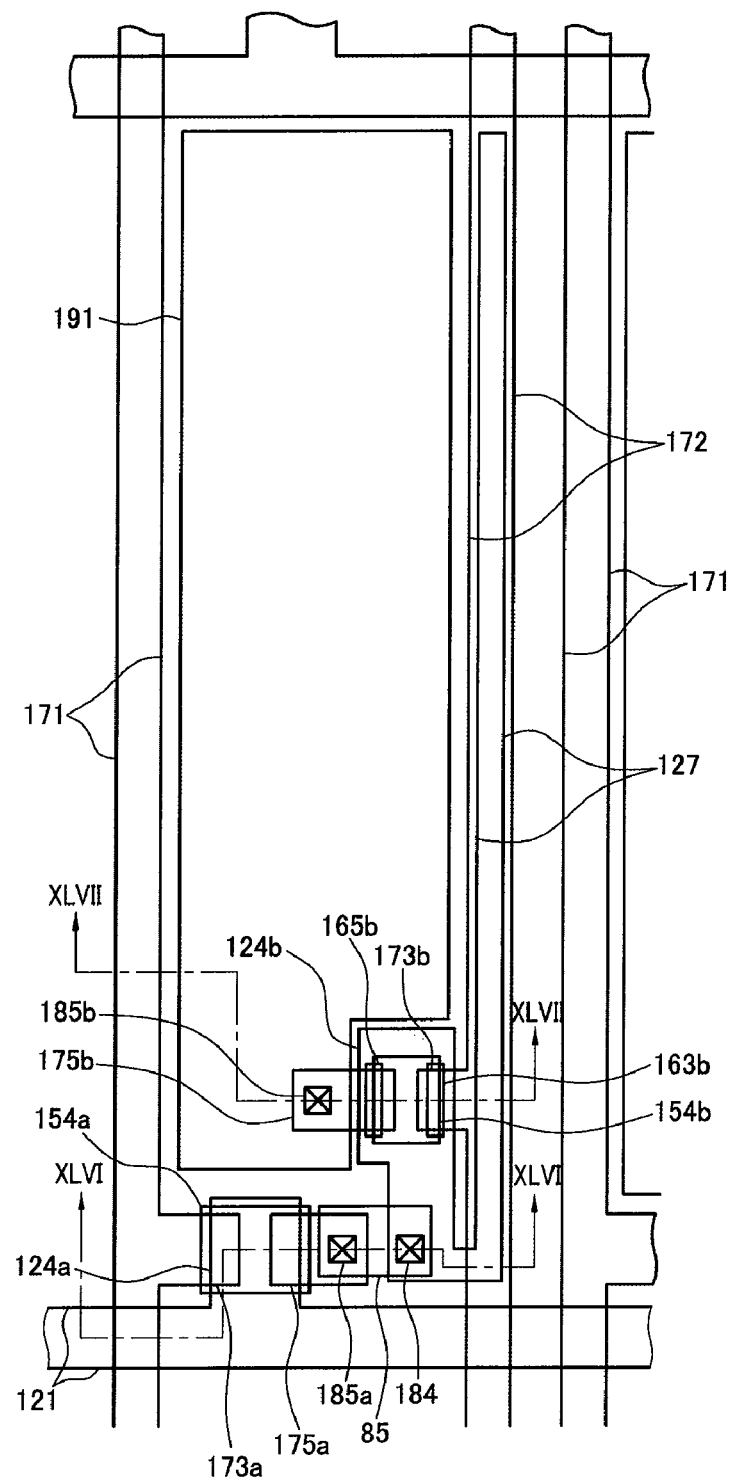
Figure 46:
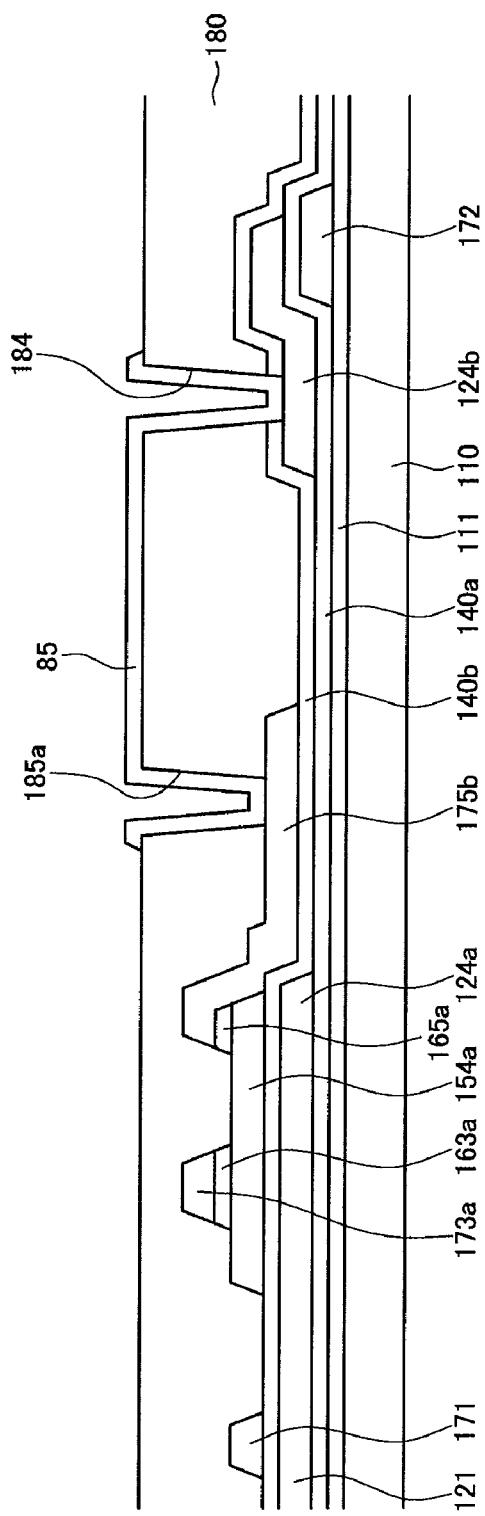
FIGS. 46 and 47 are sectional views of the TFT array panel shown in FIG. 45 taken along the lines XLVI-XLVI and XLVII-XLVII.
Figure 47:
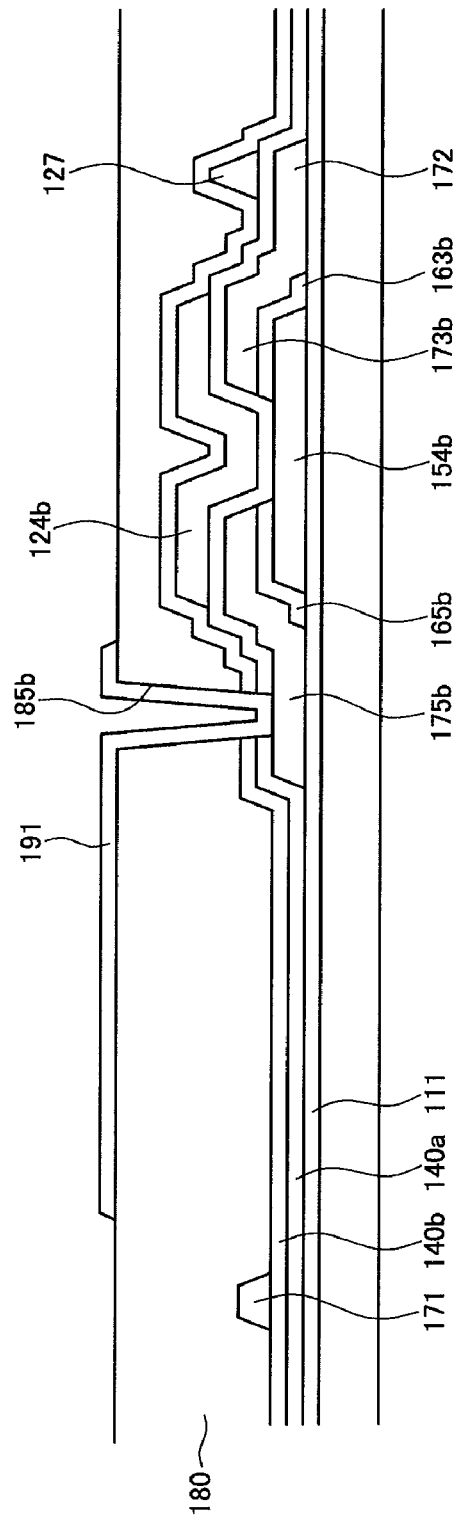

FIGS. 25, 30, 33, 36, 39, 42, and 45 are layout views of the TFT array panel shown in FIGS. 22 to 24 in intermediate steps of a manufacturing method thereof according to an embodiment of the present invention, FIGS. 26 and 27 are sectional views of the TFT array panel shown in FIG. 25 taken along the lines XXVI-XXVI and XXVII-XXVII, FIGS. 28 and 29 are sectional views of the TFT array panel in the step following the step shown in FIGS. 26 and 27, respectively, FIGS. 31 and 32 are sectional views of the TFT array panel shown in FIG. 30 taken along the lines XXXI-XXXI and XXXII-XXXII, respectively, FIGS. 34 and 35 are sectional views of the TFT array panel shown in FIG. 33 taken along the lines XXXIV-XXXIV and XXXV-XXXV, respectively, FIGS. 37 and 38 are sectional views of the TFT array panel shown in FIG. 36 taken along the lines XXXVII-XXXVII and XXXVIII-XXX-VIII, respectively, FIGS. 40 and 41 are sectional views of the TFT array panel shown in FIG. 30 taken along the lines XL-XL and XLI-XLI, respectively, FIGS. 43 and 44 are sectional views of the TFT array panel shown in FIG. 42 taken along the lines XLIII-XLIII and XLIV-XLIV, respectively, and FIGS. 46 and 47 are sectional views of the TFT array panel shown in FIG. 45 taken along the lines XLVI-XLVI and XLVII-XLVII.

As shown in FIGS. 25 to 27, a blocking film 111 preferably made of silicon nitride ($SiN_x$) is formed on an insulating substrate 110 such as transparent glass, quartz, or sapphire.

Next, amorphous silicon is deposited and then crystallized to form a polycrystalline silicon layer as in FIGS. 5 to 8, and then the polycrystalline silicon layer is patterned by photolithography to form a plurality of driving semiconductor islands 154b.

Next, as shown in FIGS. 28 and 29, a photoresist film PR is formed on the driving semiconductor islands 154b. To define the region on which an ohmic contact layer is formed, the photoresist PR is removed in the region on which an ohmic contact layer is formed, and the photoresist PR covers the remaining portion where a region including a channel region is disposed.

Then, an amorphous silicon layer 60 doped with impurities is deposited on the photoresist film PR to a thickness of about 500 Å. It is preferable that the amorphous silicon layer 60 is deposited at a temperature of less than 150 degrees to prevent the photoresist film PR from being hardened.

Next, as shown in FIGS. 30 to 32, the amorphous silicon layer 60 disposed on the photoresist film PR and the photoresist film PR are removed by a lift-off method to form a plurality of pairs of ohmic contacts 163b and 165b.

Then, thermal treatment is executed at a temperature of about 400° C. to improve contact characteristics between the ohmic contacts 163b and 165b, and the semiconductor islands 154b.

Thereafter, HF cleaning and plasma treatment are executed in order to stabilize the exposed surfaces of the semiconductor islands 154b. Here, the plasma treatment is performed under the conditions of about 200 Watt/12,000 mm$^2$ power and about 1000-3000 mT pressure with a flow rate of about 1000-3000 sccm for 90-180 seconds.

Next, as shown in FIGS. 33 to 35, a conductive layer is sputtered or deposited by CVD and photo-etched to form a plurality of driving voltage lines 172 including driving input electrodes 173b, and a plurality of driving output electrodes 175b.

Next, as shown in FIGS. 36 to 38, first gate insulating layer 140a made of silicon nitride is formed on the data conductors 172 and 175b.

Thereafter, a plurality of gate conductors that include a plurality of gate lines 121 including switching control electrodes 124a, and a plurality of driving control electrodes 124b including a plurality of storage electrodes 127, are formed on the gate insulating layer 140.

Next, as shown in FIGS. 39 to 41, a second gate insulating layer 140b made of silicon nitride is formed on the gate conductors 121 and 124b.

Thereafter, undoped amorphous silicon and doped amorphous silicon are deposited and patterned to form a plurality of switching semiconductor islands 154a and a plurality of ohmic contact patterns 164.

Next, as shown in FIGS. 42 to 44, a conductive layer is sputtered or deposited by CVD and photo-etched to form a plurality of data lines 171 including switching input electrodes 173a, and a plurality of switching output electrodes 175a.

Thereafter, the ohmic contact patterns 164 are etched by using the data lines 171 and the switching output electrode 175a as an etch mask to form a plurality of ohmic contacts 163a and 165a.

On the other hand, the ohmic contacts 163a and 165a may be formed by a lift-off method as in the previous embodiment using the photoresist film, as shown in FIGS. 28 to 32.

Referring to FIGS. 45 to 47, a passivation layer 180 is deposited by CVD or printing, etc., and patterned along with the gate insulating layer 140 to form a plurality of contact holes 184, 185a, and 185b on the gate conductors 121 and 124b.

Next, a transparent conductive film is deposited on the passivation layer 180 by sputtering, etc., and is photo-etched to form a plurality of pixel electrodes 191 and a plurality of connecting members 85.

Referring to FIGS. 22 to 24, a photosensitive organic insulator is spin-coated, and exposed and developed to form a partition 361 having openings 365 extending to the pixel electrodes 191.

Next, a plurality of organic light emitting members 370 and a common electrode 270 are sequentially formed on the organic light emitting members 370 and the partition 361.

Figure 48:
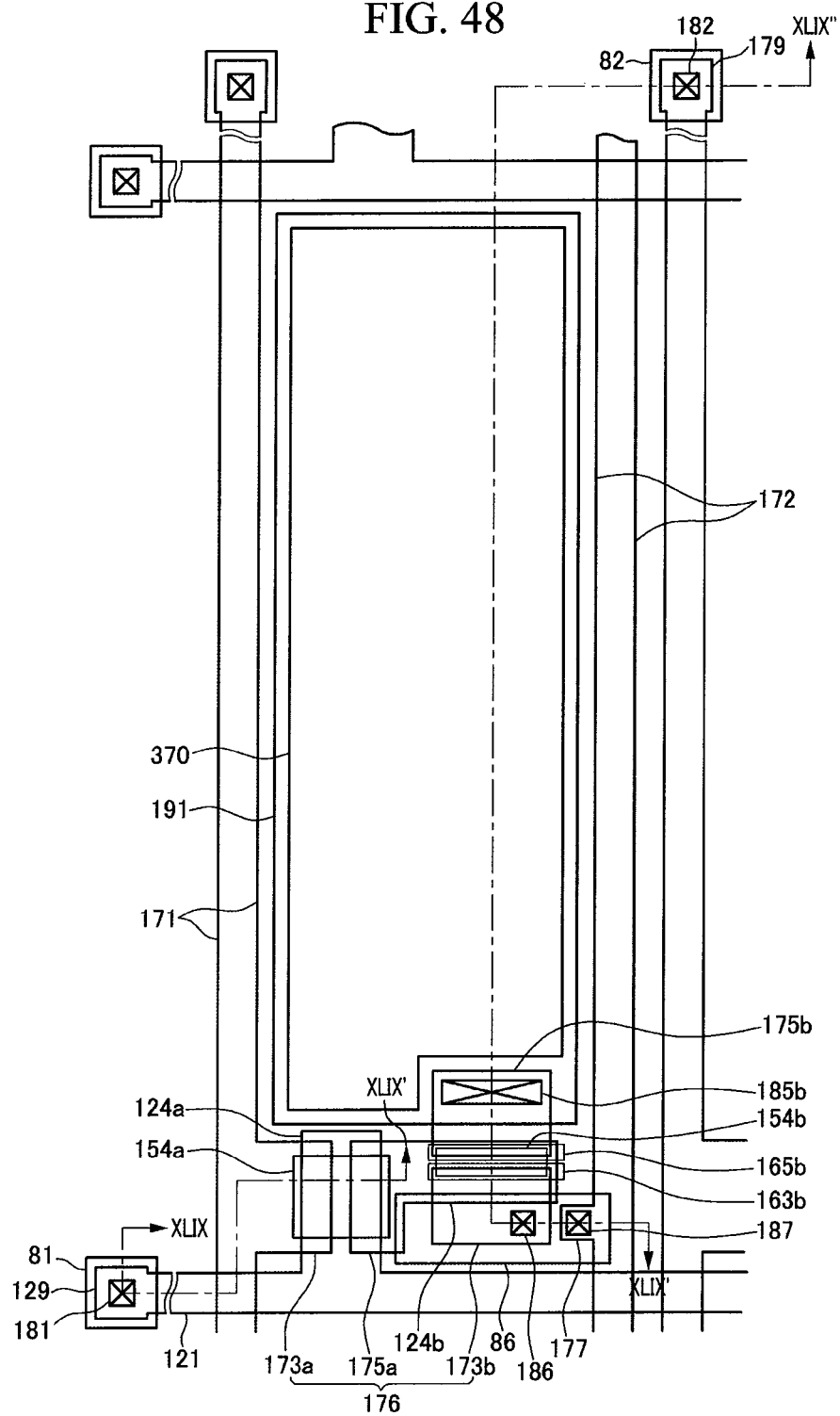
FIG. 48 is an exemplary layout view of a TFT array panel for an OLED according to another embodiment of the present invention.
Figure 49:
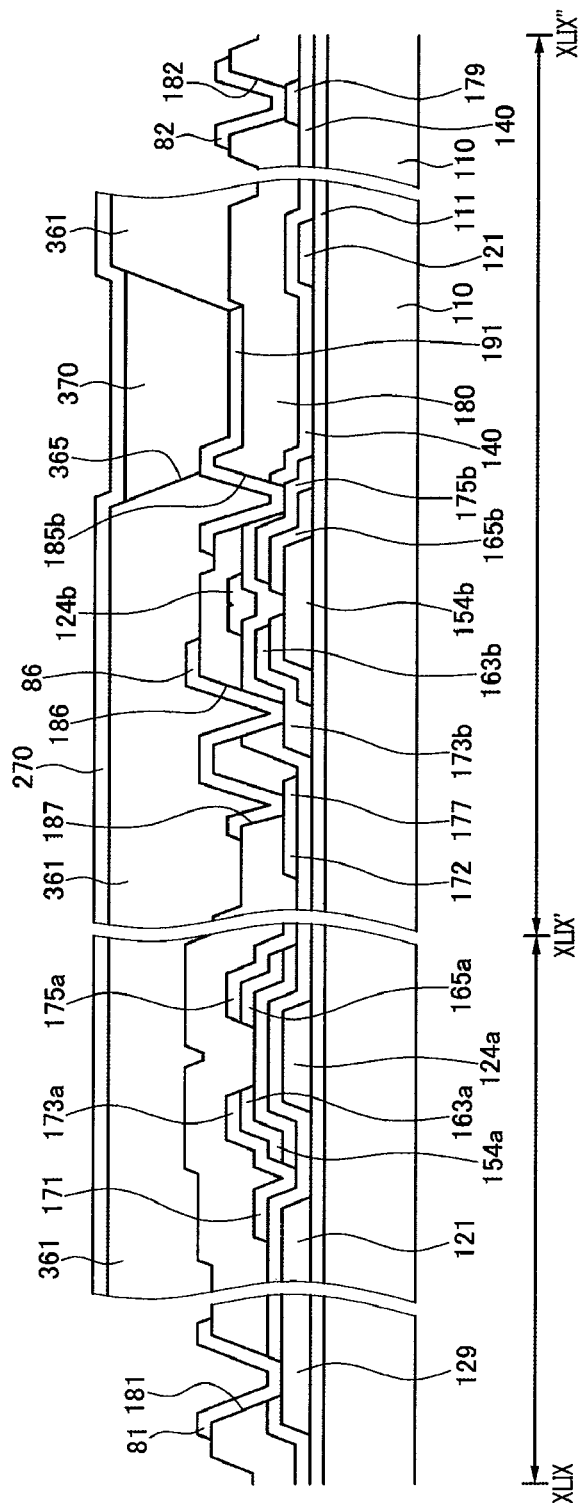
FIG. 49 is a sectional view of the TFT array panel shown in FIG. 48, taken along the lines XLIX-XLIX'-XLIX"

Referring to FIGS. 48 and 49, a detailed structure of the OLED display according to another embodiment of the present invention will be described in detail.

FIG. 48 is an exemplary layout view of a TFT array panel for an OLED according to another embodiment of the present invention, and FIG. 49 is a sectional view of the TFT array panel shown in FIG. 48, taken along the lines XLIX-XLIX'-XLIX".

A blocking film 111 preferably made of silicon oxide (SiO$_2$) or silicon nitride (SiN$_x$) is formed on an insulating substrate 110 such as transparent glass, quartz, or sapphire. The blocking film 111 may have a multi-layered structure.

A plurality of driving semiconductor islands 154b preferably made of hydrogenated amorphous silicon (abbreviated to "a-Si") or polysilicon are formed thereon.

A plurality of pairs of ohmic contacts 163b and 165b are formed on the driving semiconductor islands 154b. The ohmic contacts 163b and 165b are preferably made of silicide or n+ hydrogenated a-Si or polysilicon heavily doped with an n-type impurity such as phosphorus. The ohmic contacts 163b and 165b are located in pairs on the driving semiconductor islands 154b.

A plurality of gate lines 121, a plurality of driving input electrodes 173b and a plurality of driving output electrodes 175b are formed on the ohmic contacts 163b and 165b and the blocking layer 111.

The gate lines 121 include a plurality of end portions 129 having a large area for contact with another layer or an external driving circuit, and a plurality of switching control electrodes 124a projecting upward from the gate lines 121.

The driving input electrodes 173b and the driving output electrodes 175b are separated from the gate lines 121 and positioned across the driving semiconductor islands 154b from each other.

A first gate insulating layer 140a preferably made of silicon nitride (SiN$_x$) or silicon oxide (SiO$_x$) is formed the driving input electrodes 173b, the driving output electrodes 175b, and the gate lines 121.

A plurality of switching semiconductor islands 154a made of amorphous silicon or polycrystalline silicon are formed on the gate insulating layer 140. The switching semiconductor islands 154a are disposed on the switching control electrodes 124a.

A plurality of data lines 171, a plurality of driving voltage lines 172, and a plurality of electrode members 176 are formed on the gate insulating layer 140 and the switching semiconductor islands 154a.

The data lines 171 include a plurality of end portions 179 having a large area for contact with another layer or an external driving circuit, and a plurality of switching input electrodes 173a protruding to the switching control electrodes 124a.

The driving voltage lines 172 for transmitting driving voltages extend substantially in the longitudinal direction. The driving voltage lines 172 intersect the gate lines 121 and are parallel to the data lines 171. Each driving voltage line 172 includes a plurality of projections 177 extending to the driving input electrodes 173b.

The electrode members 176 are island-shaped and are separated from the data lines 171 and the driving voltage lines 172. The electrode members 176 include the portions 175a (a switching output electrodes) disposed opposite to the switching input electrodes 173a and the portions 124b (driving control electrodes) overlapping the driving semiconductor islands 154b. The switching input electrodes 173a and the switching output electrodes 175a are disposed across the switching semiconductor islands 154a from each other.

A plurality of pairs of ohmic contacts 163a and 165a are respectively formed between the switching semiconductor islands 154a, and the switching input electrodes 173a and the switching output electrodes 175a. The ohmic contacts 163a and 165a are preferably made of silicide or n+ hydrogenated a-Si heavily doped with an n-type impurity such as phosphorus. The ohmic contacts 163a and 165a are located in pairs on the switching semiconductor islands 154a.

A passivation layer 180 made of an organic material or an inorganic material is formed on the data lines 171, the driving voltage lines 172, and the electrode members 176.

The passivation layer 180 has a plurality of contact holes 187 and 182 extending to the projections 177 of the driving voltage lines 172 and the end portions 179 of the data lines 171. Also, the passivation layer 180 and the gate insulating layer 140 have a plurality of contact holes 185b, 181, and 186 extending to the driving output electrodes 175b, the driving input electrodes 173b and the end portions 129 of the gate lines 121.

A plurality of pixel electrodes 191, a plurality of connection members 86, and a plurality of contact assistants 81 and 82 are formed on the passivation layer 180, and they are preferably made of a transparent conductor such as ITO or IZO.

The pixel electrodes 191 are connected to the switching output electrodes 175b through the contact holes 185b.

The connecting members 86 are connected to the projections 177 of the driving voltage lines 172 and the driving input electrodes 173b through the contact holes 186 and 187, respectively.

The contact assistants 81 and 82 are connected to the end portions 129 of the gate lines 121 and the end portions 179 of the data lines 171 through the contact holes 181 and 182, respectively, and they protect the end portions 129 and 179 and enhance the adhesion between the end portions 129 and 179 and external devices.

Like the previous embodiments, a partition 361 that defines openings 365 is formed on the passivation layer 180, a plurality of light emitting members 370 are formed on the pixel electrodes 191 and confined in the openings 365 defined by the partition 361. A common electrode 270 is formed on the light emitting members 370 and the partition 361.

Now, a method of manufacturing the display panel shown in FIGS. 48 and 49 is described with reference to FIGS. 50 to 62 as well as FIGS. 48 and 49.

Figure 50:
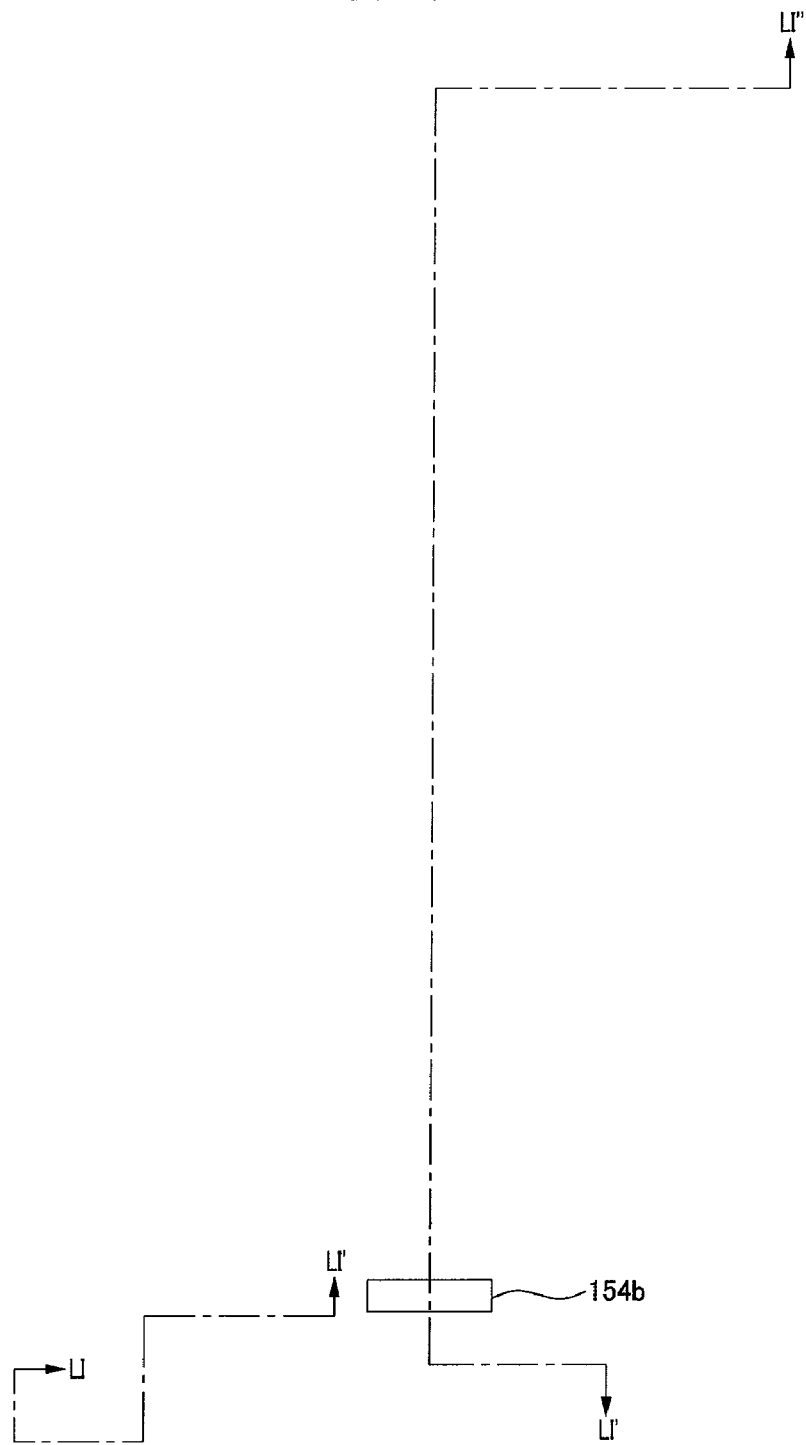
FIGS. 50, 53, 55, 57, 59 and 61 are layout views of the TFT array panel shown in FIGS. 48 and 49 in intermediate steps of a manufacturing method thereof according to an embodiment of the present invention.
Figure 51:
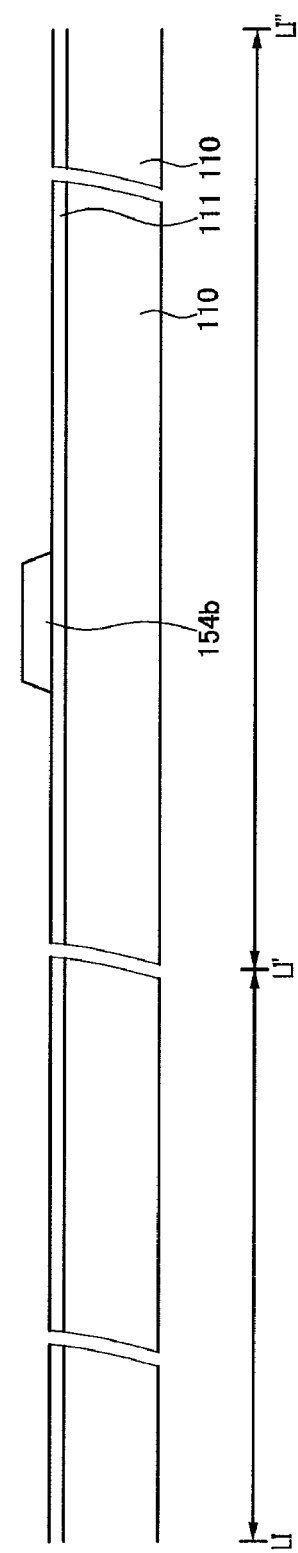
FIG. 51 is a sectional view of the TFT array panel shown in FIG. 50 taken along the line LI-LI'-LI"
Figure 52:
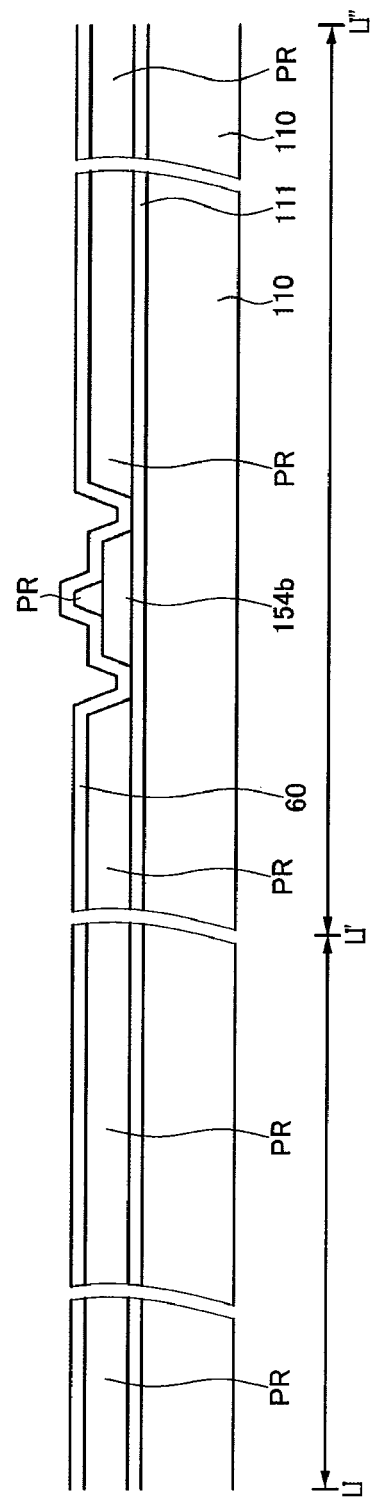
FIG. 52 is a sectional view of the TFT array panel in the step following the step shown in FIG. 51.
Figure 53:
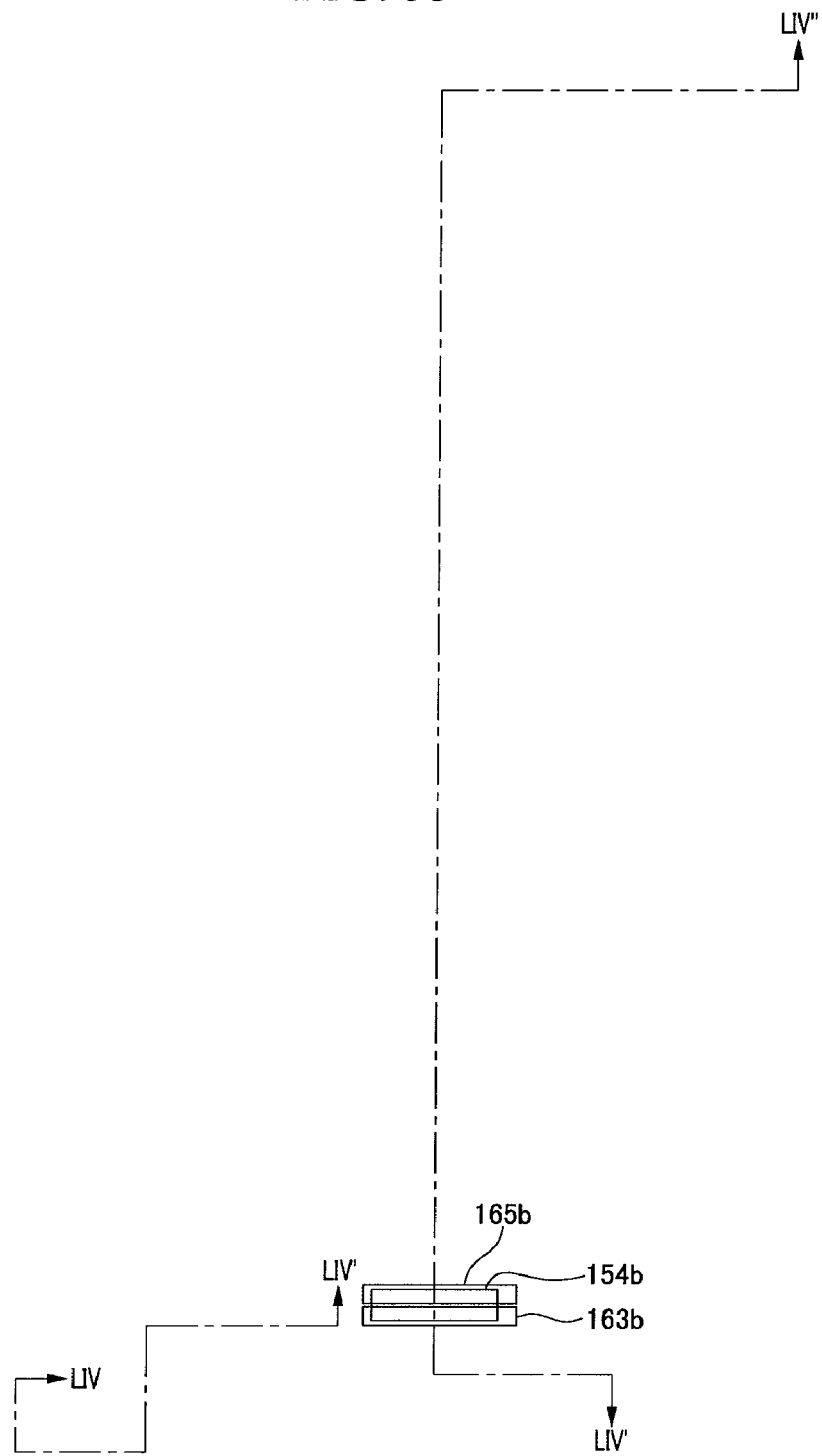
Figure 54:
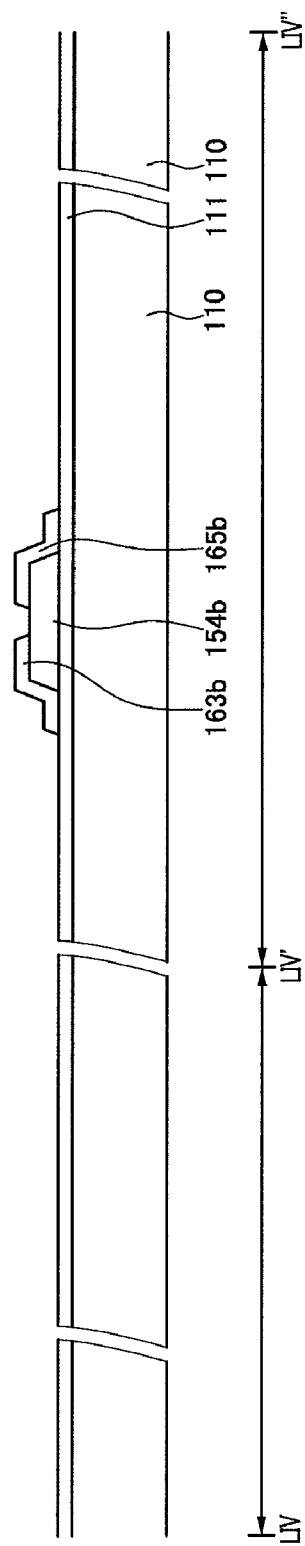
FIG. 54 is a sectional view of the TFT array panel shown in FIG. 53 taken along the line LIV-LIV'-LIV"
Figure 55:
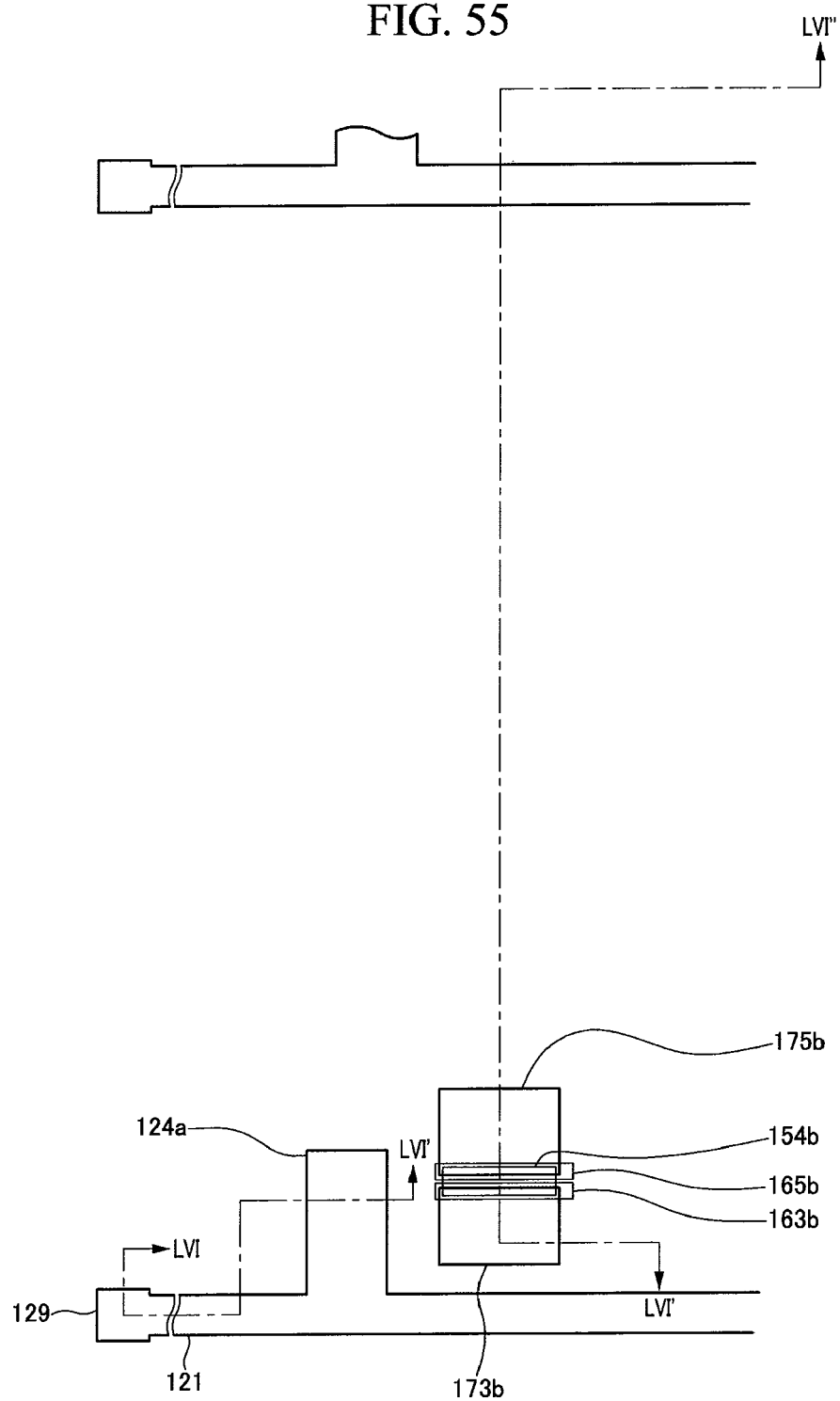
Figure 56:
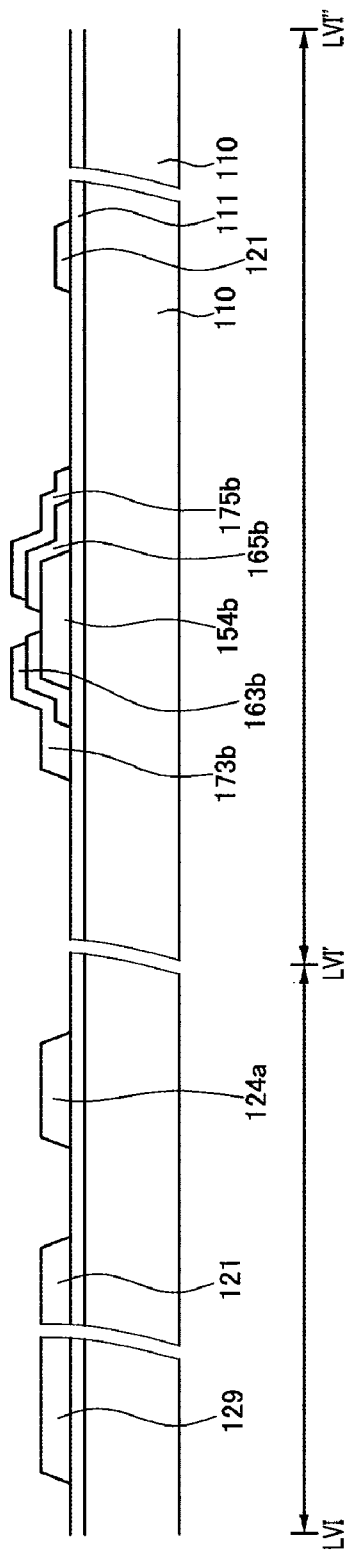
FIG. 56 is a sectional view of the TFT array panel shown in FIG. 55 taken along the line LVI-LVI'-LVI"
Figure 57:
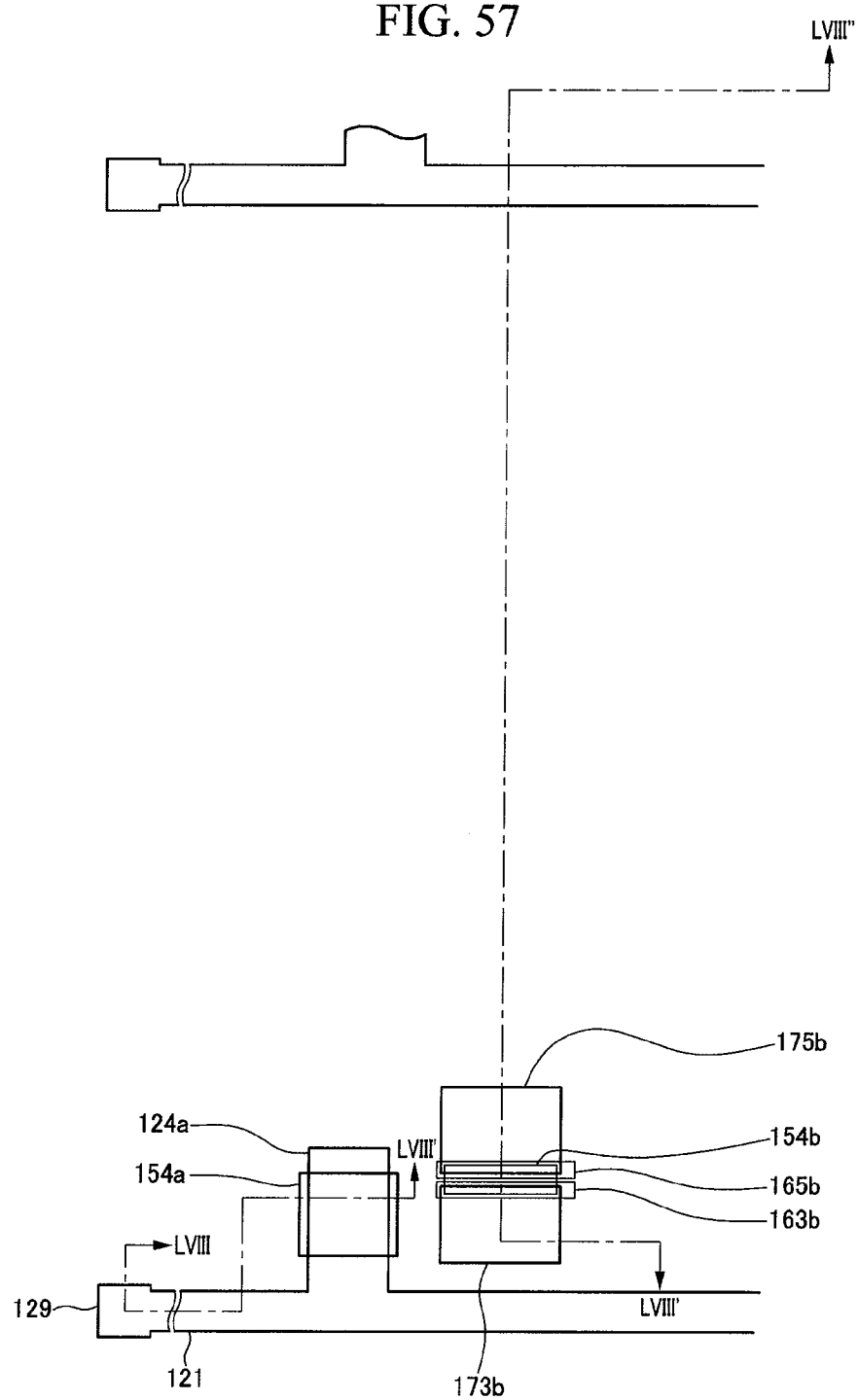
Figure 58:
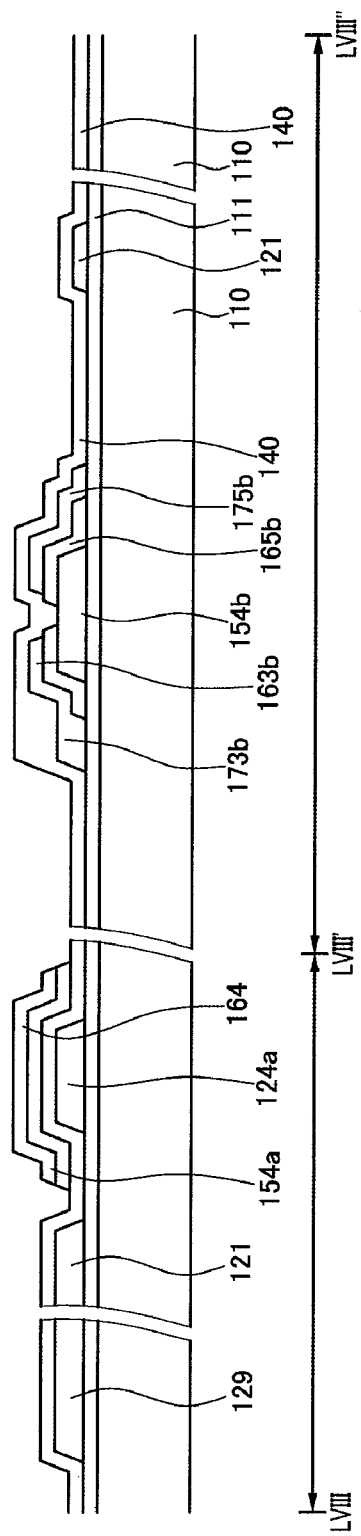
FIG. 58 is a sectional view of the TFT array panel shown in FIG. 57 taken along the lines LVIII-LVIII'-LVIII"
Figure 59:
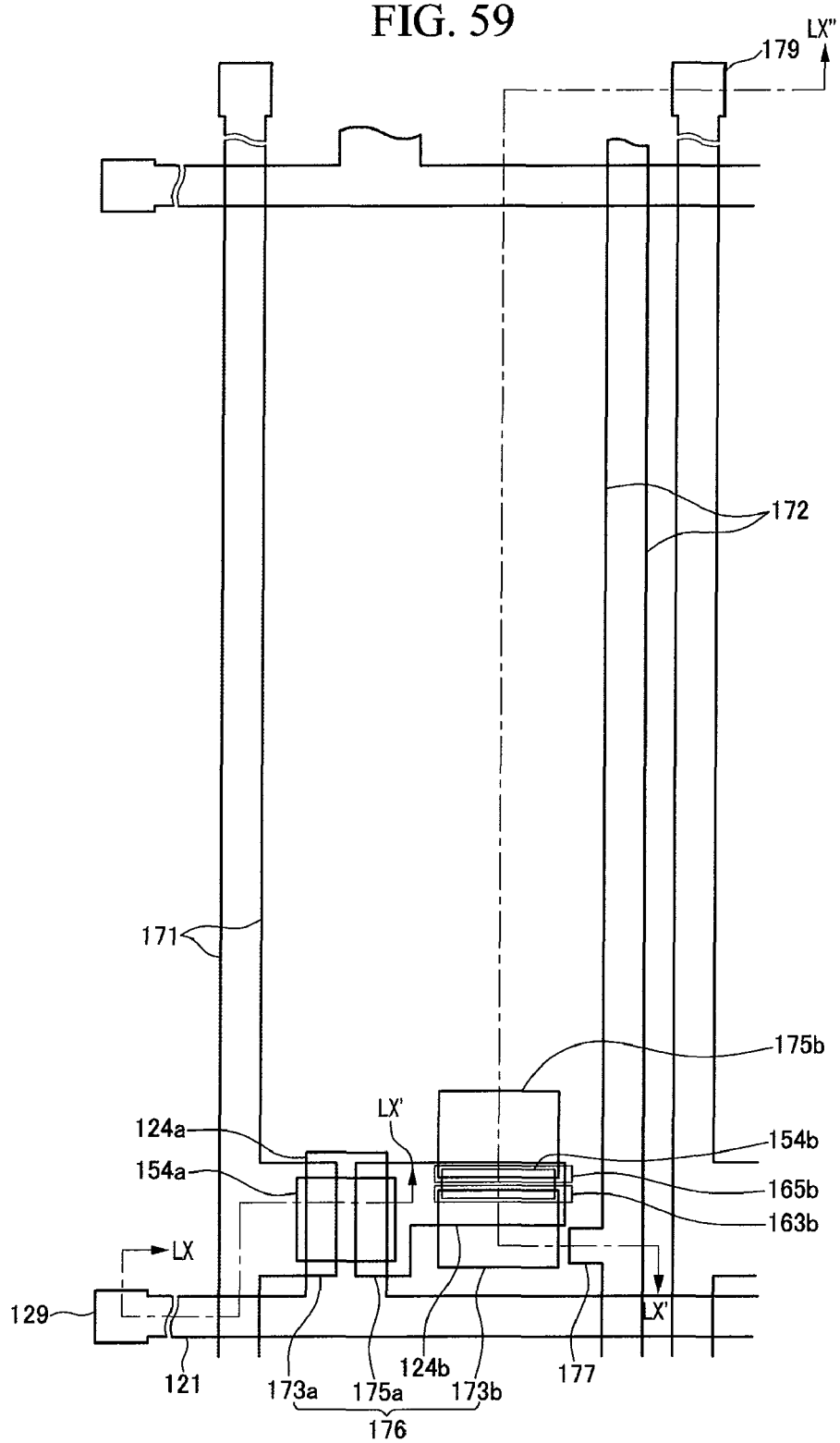
Figure 60:
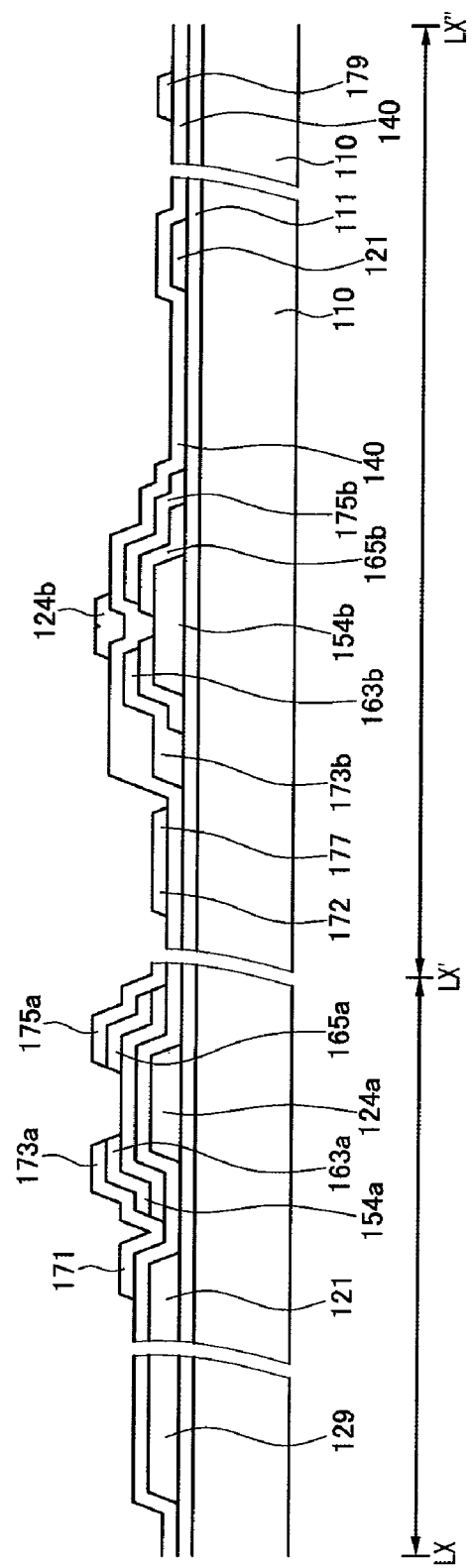
FIG. 60 is a sectional view of the TFT array panel shown in FIG. 59 taken along the lines LX-LX'-LX"
Figure 61:
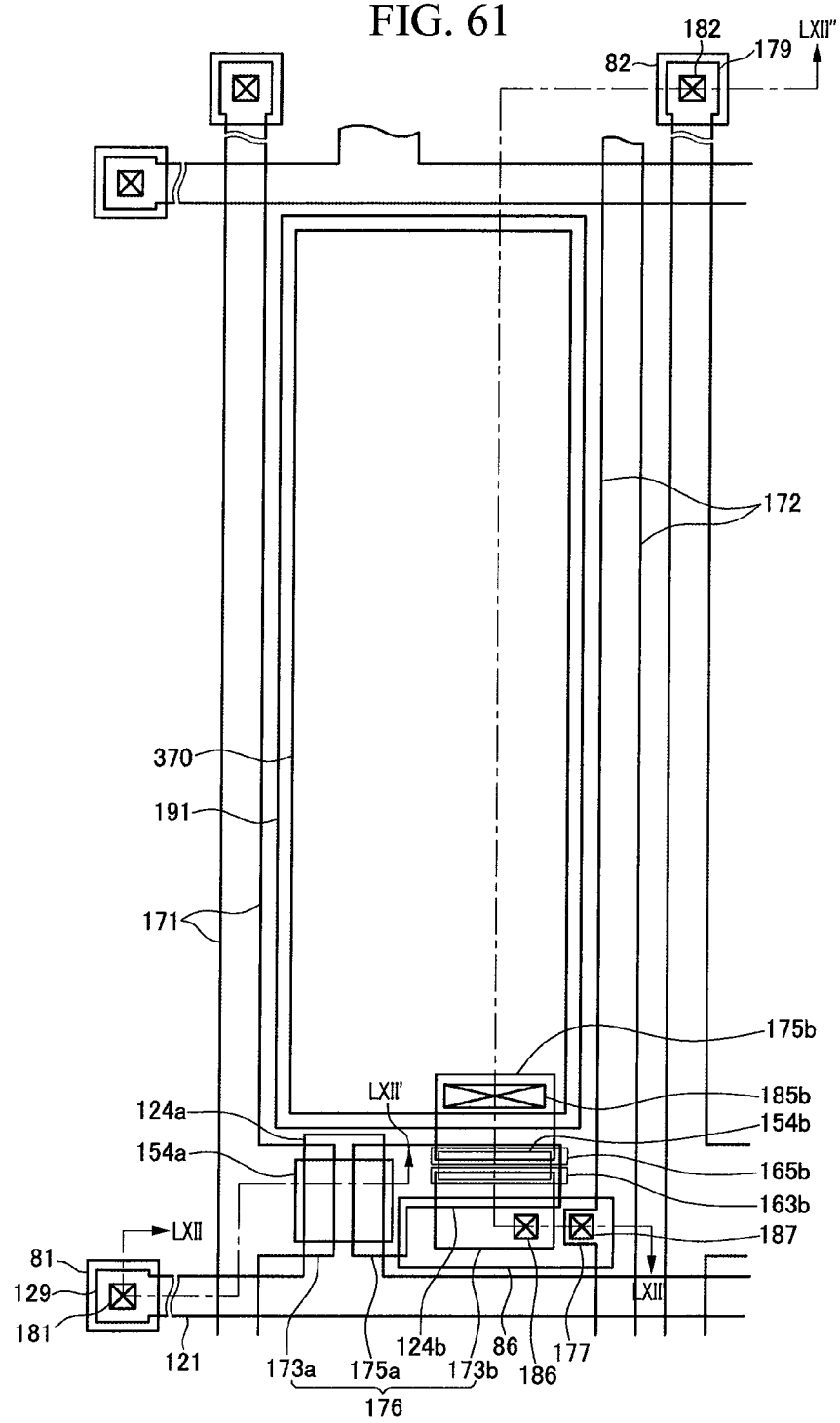
Figure 62:
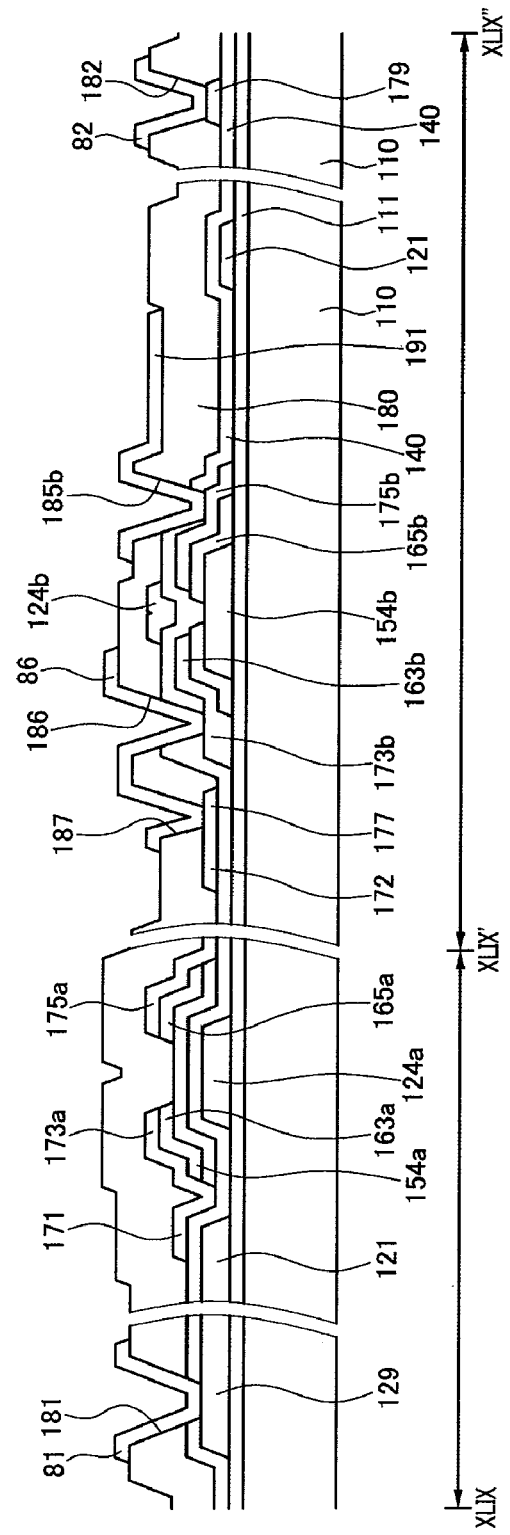
FIG. 62 is a sectional view of the TFT array panel shown in FIG. 61 taken along the lines LXII-LXII'-LXII".

FIGS. 50, 53, 55, 57, 59 and 61 are layout views of the TFT array panel shown in FIGS. 48 and 49 in intermediate stages of a manufacturing method thereof according to an embodiment of the present invention, FIG. 51 is a sectional view of the TFT array panel shown in FIG. 50 taken along the line LI-LI'-LI", FIG. 52 is a sectional view of the TFT array panel in the step following the step shown in FIG. 51, FIG. 54 is a sectional view of the TFT array panel shown in FIG. 52 taken along the line LIV-LIV'-LIV", FIG. 56 is a sectional view of the TFT array panel shown in FIG. 55 taken along the line LVI-LVI'-LVI", FIG. 58 is a sectional view of the TFT array panel shown in FIG. 57 taken along the lines LVIII-LVIII'-LVIII", FIG. 60 is a sectional view of the TFT array panel shown in FIG. 59 taken along the lines LX-LX'-LX", and FIG. 62 is a sectional view of the TFT array panel shown in FIG. 61 taken along the lines LXII-LXII'-LXII".

As shown in FIGS. 50 to 51, a blocking film 111 preferably made of silicon nitride (SiNx) is formed on an insulating substrate 110 such as transparent glass, quartz, or sapphire.

Next, amorphous silicon is deposited and then crystallized to form a polycrystalline silicon layer as in FIGS. 5 to 8, and then the polycrystalline silicon layer is patterned by photolithography to form a plurality of driving semiconductor islands 154b.

Next, as shown in FIG. 52, a photoresist film PR is formed on the driving semiconductor islands 154b. To define the region on which an ohmic contact layer is formed, the photoresist PR is removed in the region at which an ohmic contact layer is formed, and the photoresist PR covers the remaining portion where a channel region is disposed.

Then, an amorphous silicon layer 60 doped with impurities is deposited on the photoresist film PR to a thickness of about 500 Å. It is preferable that the amorphous silicon layer 60 is deposited at a temperature of less than 150 degrees to prevent the photoresist film PR from being hardened.

Next, as shown in FIGS. 53 to 54, the amorphous silicon layer 60 disposed on the photoresist film PR and the photoresist film PR is removed by a lift-off method to form a plurality of pairs of ohmic contacts 163b and 165b.

Then, thermal treatment is executed at a temperature of about 400° C. to improve the contact characteristics between the ohmic contacts 163b and 165b, and the semiconductor islands 154b.

Thereafter, HF cleaning and plasma treatment are executed in order to stabilize the exposed surfaces of the semiconductor islands 154b. Here, the plasma treatment is performed under the conditions of about 200 Watt/12,000 $mm^2$ power and about 1000-3000 mT pressure with a flow rate of about 1000-3000 sccm for 90-180 seconds.

Next, as shown in FIGS. 55 to 56, a conductive layer is sputtered or deposited by CVD and photo-etched to form a plurality of gate lines 121 including a plurality of switching control electrodes 124a, a plurality of driving input electrodes 173b, and a plurality of driving output electrodes 175b.

Next, as shown in FIGS. 57 to 58, a gate insulating layer 140 made of silicon nitride is formed on the gate lines 121, the driving input electrodes 173b, and the driving output electrodes 175b.

Thereafter, undoped amorphous silicon and doped amorphous silicon are deposited and patterned to form a plurality of switching semiconductor islands 154a and a plurality of ohmic contact patterns 164.

Next, as shown in FIGS. 59 to 60, a conductive layer is sputtered or deposited by CVD and photo-etched to form a plurality of data lines 171, a plurality of electrode members 176, and a plurality of driving voltage lines 172 including projections 177.

Thereafter, the ohmic contact patterns 164 are etched by using the data lines 171, the electrode members 176, and the driving voltage lines 172 as an etch mask to form a plurality of ohmic contacts 163a and 165a.

On the other hand, the ohmic contacts 163a and 165a may be formed by a lift-off method as in the previous embodiment using the photoresist film, as shown in FIGS. 28 to 32.

Referring to FIGS. 61 to 62, a passivation layer 180 is deposited by CVD or printing, etc., and patterned along with the gate insulating layer 140 to form a plurality of contact holes 181, 182, 186, 185b, and 187.

Next, a transparent conductive film is deposited on the passivation layer 180 by sputtering, etc., and it is photo-etched to form a plurality of pixel electrodes 191, a plurality of connecting members 86, and a plurality of contact assistants 81 and 82.

Referring to FIGS. 48 to 49, a photosensitive organic insulator is spin-coated and exposed and developed to form a partition 361 having openings 365 partly exposing the pixel electrodes 191.

Next, a plurality of organic light emitting members 370 and a common electrode 270 is sequentially formed on the organic light emitting members 370 and the partition 361.

As above-described, the semiconductor of the driving thin film transistor is made of polycrystalline silicon such that high carrier mobility and stability for flowing sufficient current to the organic light emitting device may be obtained, thereby improving the brightness of the OLED.

Also, the semiconductor of the switching thin film transistor is made of amorphous silicon to reduce off-current such that a high on/off current ratio ($I_{on}/I_{off}$) may be formed in comparison with the driving thin film transistor.

In these embodiments according to the present invention, while the switching and the driving thin film transistor are respectively formed one by one, at least one thin film transistor and a plurality of signal lines for driving the added thin film transistor may be added to improve the characteristics of the OLED.

Also, the ohmic contact layers are easily formed by using the lift-off method without etching the silicon layer for the ohmic contact layers such that damage to the surface of the semiconductor where the channel of the thin film transistor is formed may be minimized. Furthermore, the surface of the semiconductor is stabilized by using the cleansing and the plasma treatment after the removal of the photoresist film such that a thin film transistor having improved characteristics may be provided.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for manufacturing an organic light emitting diode display, comprising:
    forming a first semiconductor on a substrate;
    forming a photoresist film on the first semiconductor;
    forming a doped amorphous silicon layer on the photoresist film;
    removing the photoresist film along the portion of the doped amorphous silicon disposed on the photoresist film to form first and second ohmic contacts;
    respectively forming first input and first output electrodes on the first and second ohmic contacts;
    forming a first insulating layer on the first input and first output electrodes; and
    forming a first control electrode on the first insulating layer.

2. The method of claim 1, further comprising:
    forming a second semiconductor on the substrate;
    forming third and fourth ohmic contacts on the second semiconductor;
    forming a second input electrode on the third ohmic contact;
    forming a second output electrode electrically connected to the first input electrode on the fourth ohmic contact; and
    forming a second control electrode overlapping the second semiconductor on the first insulating layer.

3. The method of claim 1, further comprising:
    forming a second control electrode on the first insulating layer;
    forming a second insulating layer on the second control electrode;
    forming a second semiconductor overlapping the second control electrode on the second insulating layer;
    forming third and fourth ohmic contacts on the second semiconductor; and
    respectively forming a second output electrode electrically connected to the first control electrode, and a second input electrode, on the third and fourth ohmic contacts.

4. The method of claim 1, further comprising:
    forming a second control electrode on the substrate;
    forming a second semiconductor overlapping the second control electrode on the first insulating layer;
    forming third and fourth ohmic contacts on the second semiconductor; and
    respectively forming a second output electrode electrically connected to the first control electrode, and a second input electrode, on the third and fourth ohmic contacts.

5. The method of claim 1, wherein the amorphous silicon layer is deposited at a temperature less than 150 degrees.

6. The method of claim 1, wherein the substrate is thermal-treated at a temperature of about 450 degree after forming the first and second ohmic contacts.

7. The method of claim 1, further comprising:
    HF cleaning the substrate after thermal-treating the substrate; and
    plasma treating the substrate to stabilize the first and second semiconductors.

8. The method of claim 7 wherein the plasma treatment is performed under the conditions of about 200 Watt/12,000 $mm^2$ power and about 1000-3000 mT pressure with a flow rate of about 1000-3000 sccm for 90-180 seconds.

9. The method of claim 7, wherein the amorphous silicon layer is crystallized by solid phase crystallization (SPC) and is patterned to form the first and second semiconductors.

10. The method of claim 1, wherein the photoresist film has openings extending to the portions of the first semiconductor, and the openings have substantially the same shapes as the first and second ohmic contacts in plan view.

* * * * *